(12) United States Patent
Reznicek et al.

(10) Patent No.: US 11,315,938 B1
(45) Date of Patent: Apr. 26, 2022

(54) STACKED NANOSHEET ROM

(71) Applicant: INTERNATIONAL BUSINESS MACHINES CORPORATION, Armonk, NY (US)

(72) Inventors: Alexander Reznicek, Troy, NY (US); Ruilong Xie, Niskayuna, NY (US); Karthik Balakrishnan, Scarsdale, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 17/126,074

(22) Filed: Dec. 18, 2020

(51) Int. Cl.
   *G11C 16/04* (2006.01)
   *H01L 27/112* (2006.01)
   *G11C 17/12* (2006.01)

(52) U.S. Cl.
   CPC .......... *H01L 27/1128* (2013.01); *G11C 17/12* (2013.01); *H01L 27/11233* (2013.01)

(58) Field of Classification Search
   CPC .......... H01L 27/1128; H01L 27/11233; G11C 17/12
   See application file for complete search history.

(56) References Cited

U.S. PATENT DOCUMENTS

| | | | |
|---|---|---|---|
| 8,823,075 B2 | 9/2014 | Purayath | |
| 9,570,609 B2 * | 2/2017 | Obradovic | ............ H01L 29/517 |
| 10,026,652 B2 | 7/2018 | Wang | |
| 10,283,516 B1 | 5/2019 | Reznicek | |
| 10,381,100 B2 | 8/2019 | Kawa | |
| 10,418,449 B2 | 9/2019 | Paul | |

(Continued)

FOREIGN PATENT DOCUMENTS

| | | |
|---|---|---|
| CN | 110783273 A | 2/2020 |
| WO | 20080348503 A3 | 3/2008 |

OTHER PUBLICATIONS

Notification of Transmittal of the International Search Report and the Written Opinion of the International Searching Authority, or the Declaration, dated Feb. 7, 2022, Applicant's or agent's file reference EIE210780PCT, International application No. PCT/CN2021/124731, 9 pages.

(Continued)

*Primary Examiner* — Pho M Luu
(74) *Attorney, Agent, or Firm* — L. Jeffrey Kelly

(57) ABSTRACT

A semiconductor device including a first nanosheet stack of two memory cells including a lower nanosheet stack on a substrate including alternating layers of a first work function metal and a semiconductor channel material vertically aligned and stacked one on top of another, and an upper nanosheet stack including alternating layers of a second work function metal and the semiconductor channel material vertically aligned and stacked one on top of another, the upper nanosheet stack vertically aligned and stacked on the lower nanosheet stack, where a first memory cell of the two memory cells including the lower nanosheet stack includes a first threshold voltage and a second memory cell of the two memory cells including the upper nanosheet stack includes a second threshold voltage, where the first threshold voltage is different than the second threshold voltage. Forming a semiconductor device including a first nanosheet stack of two memory cells.

20 Claims, 20 Drawing Sheets

(56) References Cited

U.S. PATENT DOCUMENTS

| | | |
|---|---|---|
| 10,453,750 B2 | 10/2019 | Pawlak |
| 10,510,622 B1 | 12/2019 | Frougier |
| 10,825,736 B1 | 11/2020 | Zhang |
| 11,069,681 B2 * | 7/2021 | Shin .................. H01L 29/42392 |
| 11,177,258 B2 * | 11/2021 | Xie ..................... H01L 27/0922 |
| 2019/0131396 A1 | 5/2019 | Zhang |
| 2019/0140050 A1 | 5/2019 | Smith |
| 2019/0221483 A1 | 7/2019 | Mulfinger |
| 2019/0319028 A1 | 10/2019 | Suh |
| 2020/0118892 A1 | 4/2020 | Cheng |
| 2020/0294866 A1 | 9/2020 | Cheng |

OTHER PUBLICATIONS

Chen et al., "Low-Voltage Programmable Gate-All-Around (GAA) Nanosheet TFT Nonvolatile Memory Using Band-to-Band Tunneling Induced Hot Electron (BBHE) Method", Journal of the Electron Devices Society, vol. 7, 2019, pp. 168-173.

* cited by examiner

Section Y-Y

Section X-X

STACKED NANOSHEET ROM

BACKGROUND

The present invention relates, generally, to the field of semiconductor manufacturing, and more particularly to fabricating read-only memory (hereinafter "ROM") in stacked nanosheet field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

Memory cells are needed in a stacked nanosheet device, including non-volatile memory. Co-integration of non-volatile memories such as ROM while fabricating stacked nanosheet FETS would provide more integrated circuitry.

SUMMARY

According to an embodiment, a semiconductor device is provided. The semiconductor device including a first nanosheet stack including two memory cells, the first nanosheet stack including a lower nanosheet stack on a substrate including alternating layers of a first work function metal and a semiconductor channel material vertically aligned and stacked one on top of another, and an upper nanosheet stack including alternating layers of a second work function metal and the semiconductor channel material vertically aligned and stacked one on top of another, the upper nanosheet stack vertically aligned and stacked on top of the lower nanosheet stack, where at least a portion of the first work function metal and a portion of the second work function metal are disposed on opposite sides of the nanosheet stack, where a first memory cell of the two memory cells including the lower nanosheet stack includes a first threshold voltage and a second memory cell of the two memory cells including the upper nanosheet stack includes a second threshold voltage, where the first threshold voltage is different than the second threshold voltage.

According to an embodiment, a semiconductor device is provided. The semiconductor device including a lower nanosheet stack on a substrate including alternating layers of a first work function metal and a semiconductor channel material vertically aligned and stacked one on top of another, and an upper nanosheet stack including alternating layers of a second work function metal and the semiconductor channel material vertically aligned and stacked one on top of another, the upper nanosheet stack vertically aligned and stacked on top of the lower nanosheet stack, a single contact connected to both the first work function metal of the lower nanosheet stack and the second work function metal of the upper nanosheet stack, wherein at least a portion of the first work function metal and a portion of the second work function metal are disposed on opposite sides of the nanosheet stack, where a first memory cell of the two memory cells including the lower nanosheet stack includes a first threshold voltage and a second memory cell of the two memory cells including the upper nanosheet stack includes a second threshold voltage, where the first threshold voltage is different than the second threshold voltage.

According to an embodiment, a method is provided. The method including forming a nanosheet stack on a substrate, the nanosheet stack including an upper nanosheet stack vertically aligned above a lower nanosheet stack, the upper nanosheet stack and the lower nanosheet stack each including alternating layers of a sacrificial material and a semiconductor channel material vertically aligned and stacked one on top of another, removing the sacrificial material layers of the lower nanosheet stack, patterning a first work function metal surrounding the semiconductor channel layers of lower nanosheet stack, removing the sacrificial material layers of the upper nanosheet stack; and patterning a second work function metal surrounding the semiconductor channel layers of the upper nanosheet stack, where a first memory cell including the lower nanosheet stack includes a first threshold voltage and a second memory cell of the upper nanosheet stack includes a second threshold voltage, where the first threshold voltage is different than the threshold voltage.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 20A illustrates an upper view of the semiconductor structure. FIGS. 20B and 20C each illustrate a cross-sectional view of the semiconductor structure along sections X-X and Y-Y, respectively, of the semiconductor structure.

Figure 1:
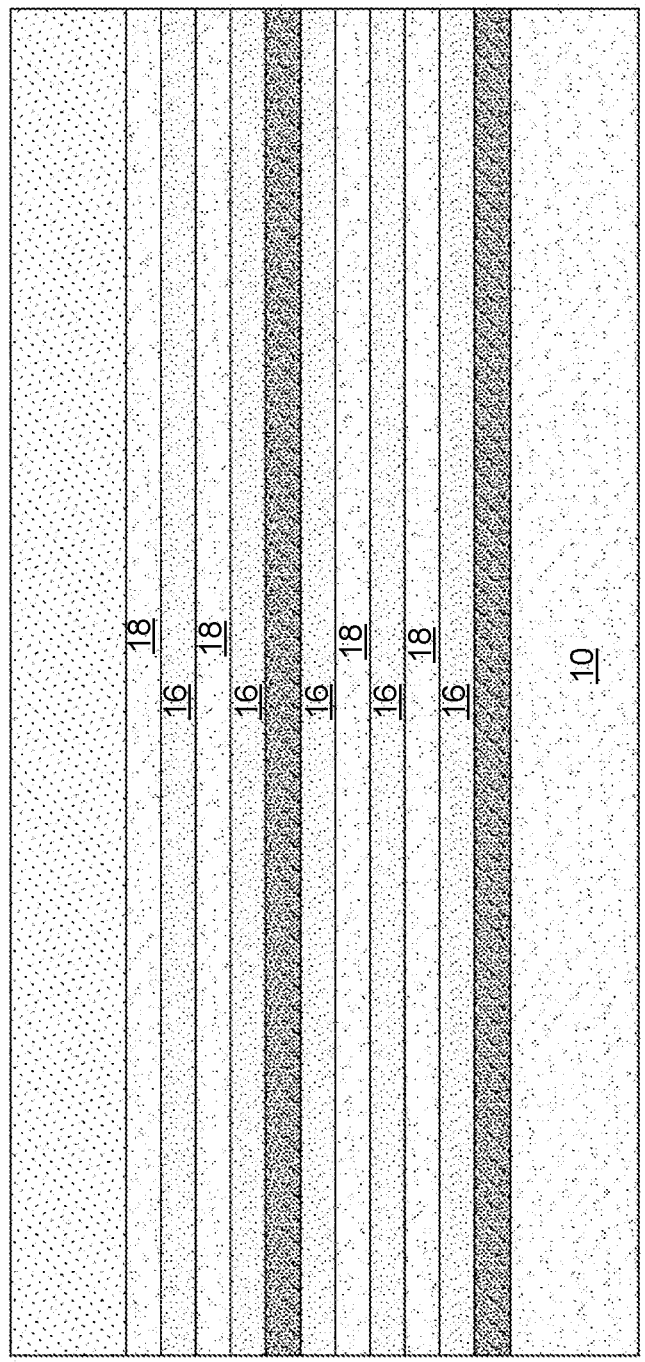
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Read-only memory (hereinafter "ROM") may be used for firmware, which is programming for a computer start-up, among other uses. Fabrication of FET used as non-volatile memory, such as ROM, is an approach for increasing density of semiconductors. Stacking two nanosheet FETs, each used as ROM, with an isolation layer between them, further increases density. Co-fabrication of nanosheet FETs used as FET with nanosheet FETs programmed as ROM can be done using simple process modifications and help to enable combined stacked nanosheet circuits with less fabrication steps than separately fabricating nanosheet FETs and other types of ROM.

The present invention relates, generally, to the field of semiconductor manufacturing, and more particularly to fabricating ROM in nanosheet FETs. The stacked nanosheet FET ROM may include two negative channel FETs (hereinafter "n-FETs"), each used as a ROM memory cell, stacked on top of each other. Alternatively, two positive channel FETs (hereinafter "p-FETs"), each used as a ROM memory cell, may be stacked on top of each other.

Programming of each ROM memory cell may be done during device fabrication by utilizing a different work function metal for different memory states, which results in different threshold voltages. A memory state may be "read" based on a memory cell being turned "on" or "off" at a read voltage which is in between the different threshold voltage values. More specifically, those ROM memory cells which have a threshold voltage above the read voltage will turn on at the read voltage and may be considered in a first memory state, and those ROM memory cells which have a threshold voltage below the read voltage will be off at the read voltage and may be considered in a second memory state.

The threshold voltage of a FET or a ROM memory cell is determined by properties of a composition of a work function metal used in the FET or ROM memory cell, along with various other device/material properties including but not limited to channel doping, growth conditions of a high-k dielectric, charge distribution within the high-k dielectric, spacing of high-k/channel interface, presence and properties of interfacial oxide formed between high-k and channel. In an embodiment, when fabricating ROM memory cells, all parts of the ROM memory cells may be fabricated at the same time with the same materials, and control of a threshold voltage for different ROM memory cells may be managed by using different work function metals for different ROM memory cells. Specifically, according to embodiments disclosed herein, a first set of ROM memory cells may have a first work function metal surrounding the channel region, and a second set of ROM memory cells may have a second work function metal surrounding the channel region. The first and the second set of ROM memory cells may be fabricated simultaneously and from the same materials, except for the formation of the work function metal for each. The resulting first set of ROM memory cells and the second set of ROM memory cells may each have a different threshold voltage, dependent, in this set of circumstances, on the respective work function metal surrounding the channel region of the ROM memory cell.

Embodiments of the present invention disclose a structure and a method of forming a double stacked FET nanosheet ROM are described in detail below by referring to the accompanying drawings in FIGS. 1-20C, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100 parallel with subsequently formed gate lines. The structure 100 of FIG. 1 may be formed or provided.

The structure 100 may include alternating layers of sacrificial semiconductor material and semiconductor channel material stacked one on top of another, covered by a hard mask 20 on a substrate 10. It should be noted that, while a limited number of alternating layers are depicted, any number of alternating layers may be formed.

The substrate 10 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 10 may be approximately, but is not limited to, several hundred microns thick. In other embodiments, the substrate 10 may be a layered semiconductor such as a silicon-on-insulator or SiGe-on-insulator, where a buried insulator layer, separates a base substrate from a top semiconductor layer.

The alternating layers of sacrificial semiconductor material and semiconductor channel material may include a nanosheet stack sacrificial layer 12 (hereinafter "stack sacrificial layer") on the substrate 10, covered by a sacrificial semiconductor material layer 16 (hereinafter "sacrificial layer"), covered by a semiconductor channel material layer 18 (hereinafter "channel layer"), covered by a sacrificial layer 16, covered by a channel layer 18, covered by a sacrificial layer 16, covered by a nanosheet stack sacrificial layer 14, (hereinafter "stack sacrificial layer"). The stack sacrificial layer 14 is covered by a sacrificial layer 16, covered by a channel layer 18, covered by a sacrificial layer 16, covered by a channel layer 18. The hard mask 20 may cover the uppermost channel layer 18.

The stack sacrificial layers 12, 14, may, for example, be silicon germanium with a germanium concentration about 60 atomic percent, although percentages greater than 60 percent and less than 60 percent may be used. The stack sacrificial layers 12, 14 can each be formed using an epitaxial growth technique. The stack sacrificial layers 12, 14 will each subsequently be removed selective to the remaining alternating layers, as described below. In an embodiment, the stack sacrificial layers 12, 14 may be the same material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 16 is composed of a first semiconductor material which differs in composition from at least an upper portion of the substrate 10, the channel layer 18 and the stack sacrificial layers 12, 14. In an embodiment, each sacrificial layer 16 may be a silicon-germanium semiconductor alloy and have a germanium concentration less than 50 atomic percent. In another example, each sacrificial layer 16 may have a germanium concentration ranging from about 20 atomic percent to about 40 atomic percent. Each sacrificial layer 16 can be formed using known deposition techniques or an epitaxial growth technique as described above.

Each channel layer 18 is composed of a second semiconductor material which differs in composition from at least the upper portion of the substrate 10, the stack sacrificial layer 12 and the sacrificial layer 16. Each channel layer 18 has a different etch rate than the first semiconductor material of sacrificial layer 16 and has a different etch rate than the stack sacrificial layer 12, 14. The second semiconductor material can be, for example, silicon. The second semiconductor material, for each channel layer 18, can be formed using known deposition techniques or an epitaxial growth technique as described above.

The alternating layers of sacrificial layer 16, channel layer 18 and the stack sacrificial layers 12, 14 can be formed by sequential epitaxial growth of alternating layers of the first semiconductor material, the second semiconductor material and the nanosheet stack sacrificial layer material.

The stack sacrificial layers 12, 14 may have a thickness ranging from about 5 nm to about 15 nm. The sacrificial layers 16 may have a thickness ranging from about 5 nm to about 12 nm, while the channel layers 18 may have a thickness ranging from about 3 nm to about 12 nm. Each sacrificial layer 16 may have a thickness that is the same as, or different from, a thickness of each channel material layer 18. In an embodiment, each sacrificial layer 16 has an identical thickness. In an embodiment, each channel layer 18 has an identical thickness.

The hard mask 20 may be formed over an upper horizontal surface of the alternating layers of sacrificial layers 16, channel layers 18 and the stack sacrificial layers 12, 14 by methods known in the art.

Figure 2:
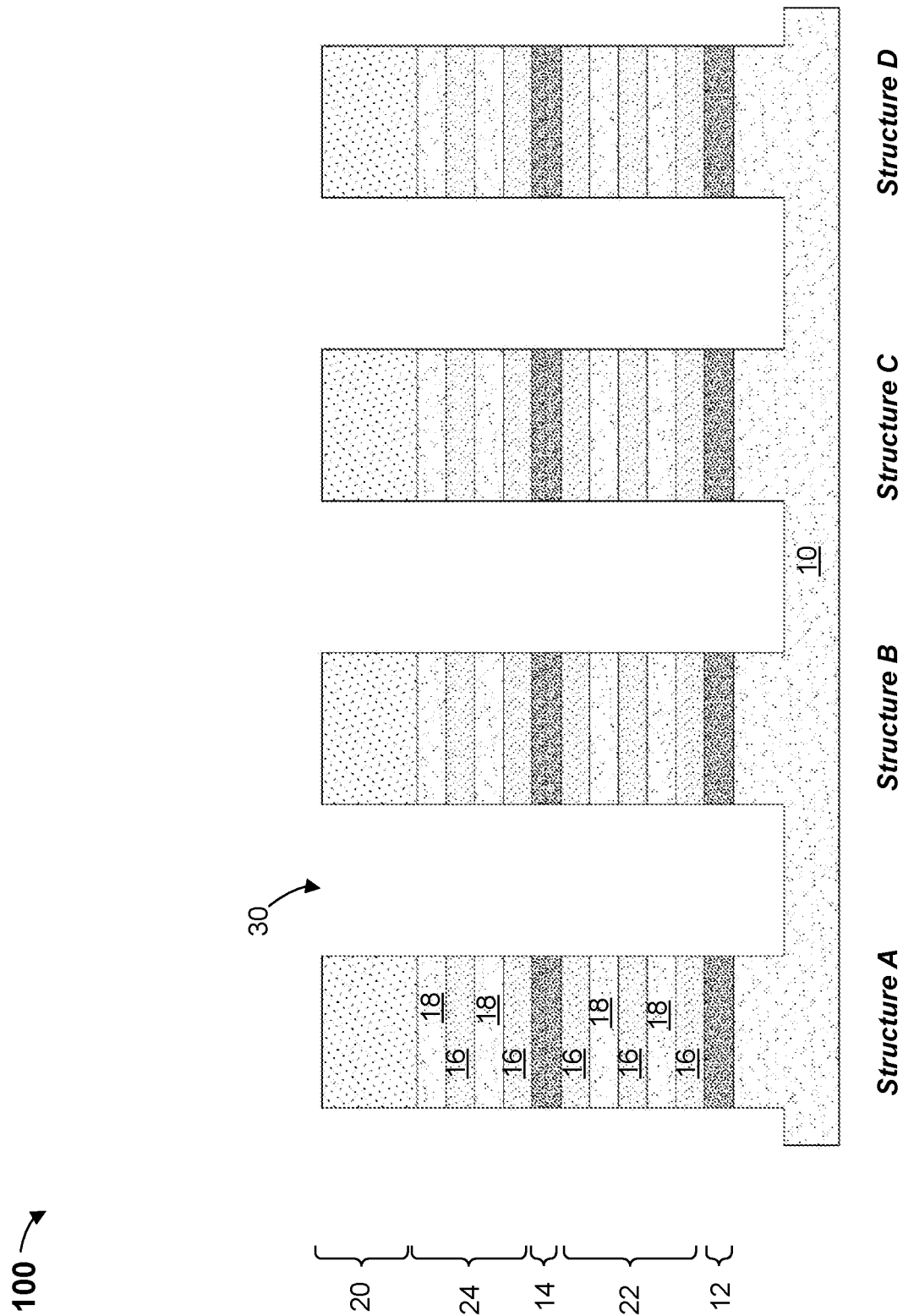
FIG. 2 illustrates a cross-sectional view of the semiconductor structure and illustrates selective removal of semiconductor material layers, according to an exemplary embodiment.

Referring now to FIG. 2, the structure 100 is shown according to an exemplary embodiment. As shown in FIG. 2, the alternating layers of sacrificial layers 16, channel layers 18, the stack sacrificial layers 12, 14 and the hard mask 20 may be formed into nanosheet stacks, each covered with the hard mask 20 by patterning the hard mask 20 and subsequent removal of portions of each layer. A trench 30 may be formed between each nanosheet stack by an anisotropic etching technique, such as, for example, reactive ion etching (RIE), and stopping on etching a portion of the substrate 10 for subsequent formation of a shallow trench isolation region between each nanosheet stack.

Each nanosheet stack may include the stack sacrificial layer 12 covered by a lower nanosheet stack 22, covered by the stack sacrificial layer 14, covered by an upper nanosheet stack 24, covered by the hard mask 20. In FIG. 1, and only by way of an example, the lower nanosheet stack 22 includes three layers of sacrificial layers 16 alternating with two layers of the channel layers 18, and the upper nanosheet stack 24 includes two layers of sacrificial layers 16 alternating with two channel layers 18. The lower nanosheet stack 22 may be separated from the upper nanosheet stack 24 by the stack sacrificial layer 14. The material stacks that can be employed in embodiments of the present invention are not limited to the specific embodiment illustrated in FIG. 1.

The lower nanosheet stack 22 and the upper nanosheet stack 24 each can include any number of sacrificial layers 16 and channel layers 18. The nanosheet stack is used to produce a gate all around device that includes vertically stacked semiconductor channel material nanosheets for a p-FET or an n-FET device.

The structure 100 may include Structure A, Structure B, Structure C and Structure D. The Structures A, B, C, D may each include a nanosheet stack with the hard mask 20 on an upper horizontal surface of the nanosheet stack. The Structures A, B, C, D are the same at this point of fabrication and remain identical unless otherwise noted. There may be any number of Structures A, B, C, D on the structure 100. In an embodiment, any of the upper nanosheet stack 24 and any of the lower nanosheet stack 22 of each Structure A, B, C, D may be formed as an individual memory cell stacked one-on-top of the other. As shown in FIG. 2, there may be a total of 8 different memory cells formed in total, 2 FETs vertically stacked and aligned in each of the Structures A, B, C, D.

Figure 3:
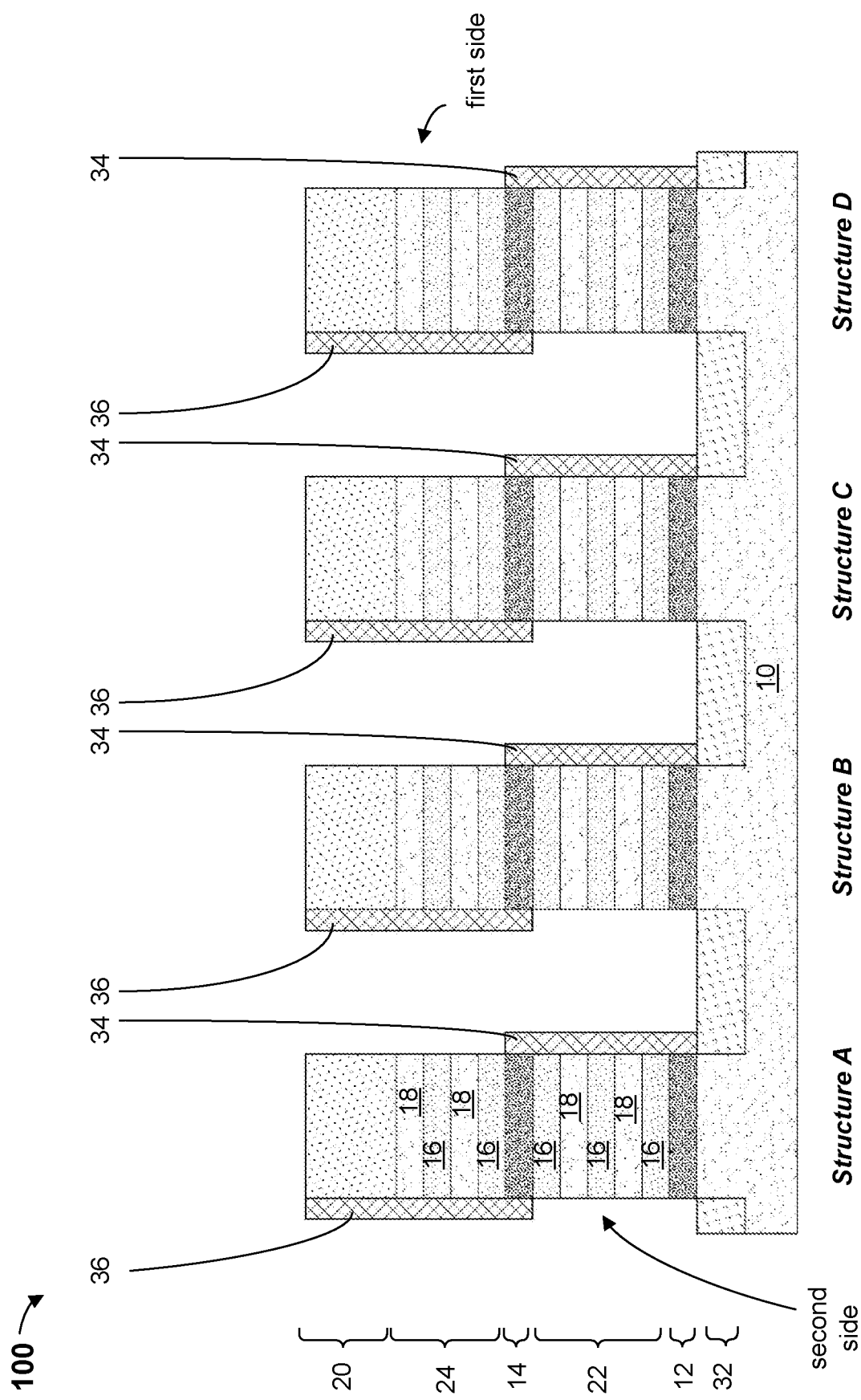
FIG. 3 illustrates a cross-sectional view of the semiconductor structure and illustrates formation of side spacers, according to an exemplary embodiment.

Referring now to FIG. 3, the structure 100 is shown according to an exemplary embodiment. As shown in FIG. 3, a shallow trench isolation region 32 (hereinafter "STI") may be formed between adjacent nanosheet stacks in a portion of the trench 30, a lower side spacer 34 and an upper side spacer 36 may each be selectively formed on portions of a vertical side surface of the nanosheet stack.

The STI 32 may be a dielectric material and may be formed in a portion of the trench 30 between adjacent nanosheet stacks formed using known patterning and deposition techniques. Adjacent nanosheet stacks shown as the Structures A, B, C, D, are isolated from one another by the STI 32. An upper horizontal surface of the STI 32 may be coplanar with an upper horizontal surface of the substrate 10, and also coplanar with a lower horizontal surface of the stack sacrificial layer 12.

The lower side spacer 34 and the upper side spacer 36 may each be formed after several processes, including for example, conformally depositing or growing a dielectric, performing an anisotropic etch process to form the lower spacer 34 adjacent to a first vertical side surface of the nanosheet stack, forming a mask which protects the lower spacer 34 on the first vertical side surface of the nanosheet stack and exposes a second side of the nanosheet stack, and selectively etching a portion of the conformal layer of spacer material to form the upper side spacer 36 on an upper portion of the second side of the nanosheet stack. The lower side spacer 34 and the upper side spacer 36 may include any dielectric material such as silicon nitride and may include a single layer or may include multiple layers of dielectric material. In an embodiment, the lower side spacer 34 and the upper side spacer 36 may be the same material.

The lower side spacer 34 may be formed adjacent to a first vertical side surface of the stack sacrificial layer 12, a first vertical side surface of the lower nanosheet stack 22 and a first vertical side surface of the stack sacrificial layer 14. A thickness of the lower side spacer 34 may range from about 6 nm to about 12 nm. The upper side spacer 36 may be formed adjacent to a second vertical side surface of the stack sacrificial layer 14, a second vertical side surface of the upper nanosheet stack 24 and a second vertical side surface of the hard mask 20. A thickness of the upper side spacer 36 may range from about 6 nm to about 12 nm.

The lower side spacer 34 and the upper side spacer 36 each provide a barrier for subsequent processing as described below. The lower side spacer 34 and the upper side spacer 36, in combination with deposition of additional layers and selective etching, may enable selective processing of the lower nanosheet stack 22 and the upper nanosheet stack 24, allowing different processing steps for each.

Figure 4:
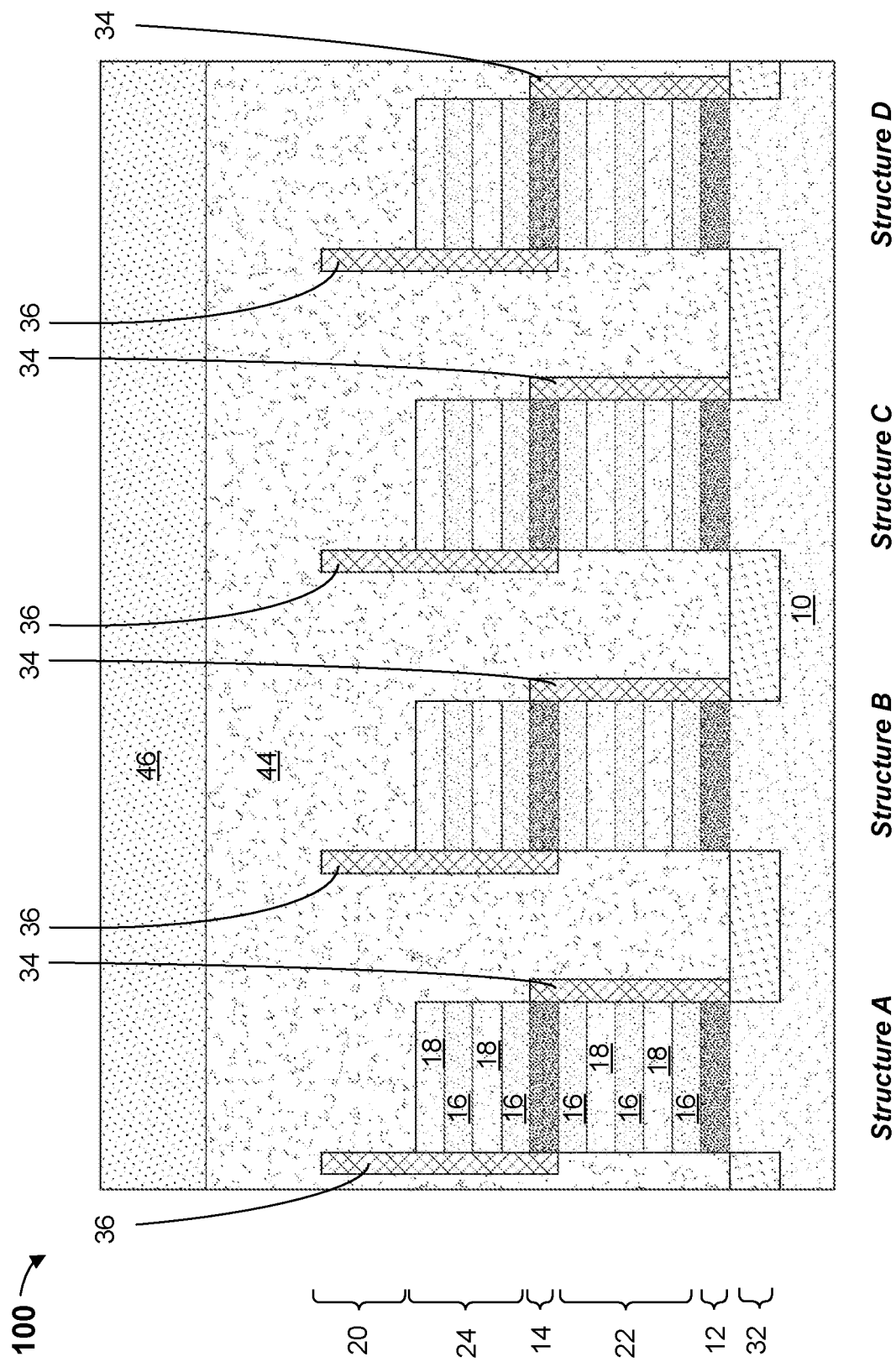
FIG. 4 illustrates a cross-sectional view of the semiconductor structure and illustrates formation of a dummy gate conductor and a gate hard mask, according to an exemplary embodiment.

Referring now to FIG. 4, the structure 100 is shown according to an exemplary embodiment. As shown in FIG. 4, the hard mask 20 may be removed, a sacrificial gate 44 may be formed, and a gate hard mask 46 may be formed.

The hard mask 20 may be removed via a standard etch process, exposing an upper horizontal surface of the upper nanosheet stack 24 and a horizontal side surface of the upper side spacer 36.

The sacrificial gate 44 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 44 can include any material including, for example, polysilicon, amorphous silicon, or multilayered combinations thereof. The sacrificial gate 44 can be formed using any deposition technique including, for example, chemical vapor deposition (CVD), physical vapor deposition (PVD), high density plasma (HDP) deposition, and spin on techniques. Optionally, a gate dielectric layer and a gate cap may be formed as part of the sacrificial gate 44 in accordance with known techniques.

In an embodiment, the sacrificial gate 44 is deposited with a thickness sufficient to fill, or substantially fill, the spaces between adjacent structures A, B, C, D and cover a horizontal upper surface of the STI 32. The sacrificial gate 44 may be adjacent to a vertical side surface and a horizontal upper surface of the lower side spacer 34. The sacrificial gate 44 may be adjacent to the second vertical side surface of the lower nanosheet stack 22. The sacrificial gate 44 may be adjacent to the first vertical side surface, a portion of the second vertical side surface, a horizontal upper surface and a horizontal lower surface, all of the upper side spacer 36. The sacrificial gate 44 may be adjacent to the first vertical side surface and the upper horizontal surface of the upper nanosheet stack 24. A height of the sacrificial gate 44 may be much thicker than the underlying structure and may have a height between 100 nm and 150 nm about the nanosheet stack.

The gate hard mask 46 may be formed over a horizontal upper surface of the sacrificial gate 44, by methods known in the art.

Figure 5:
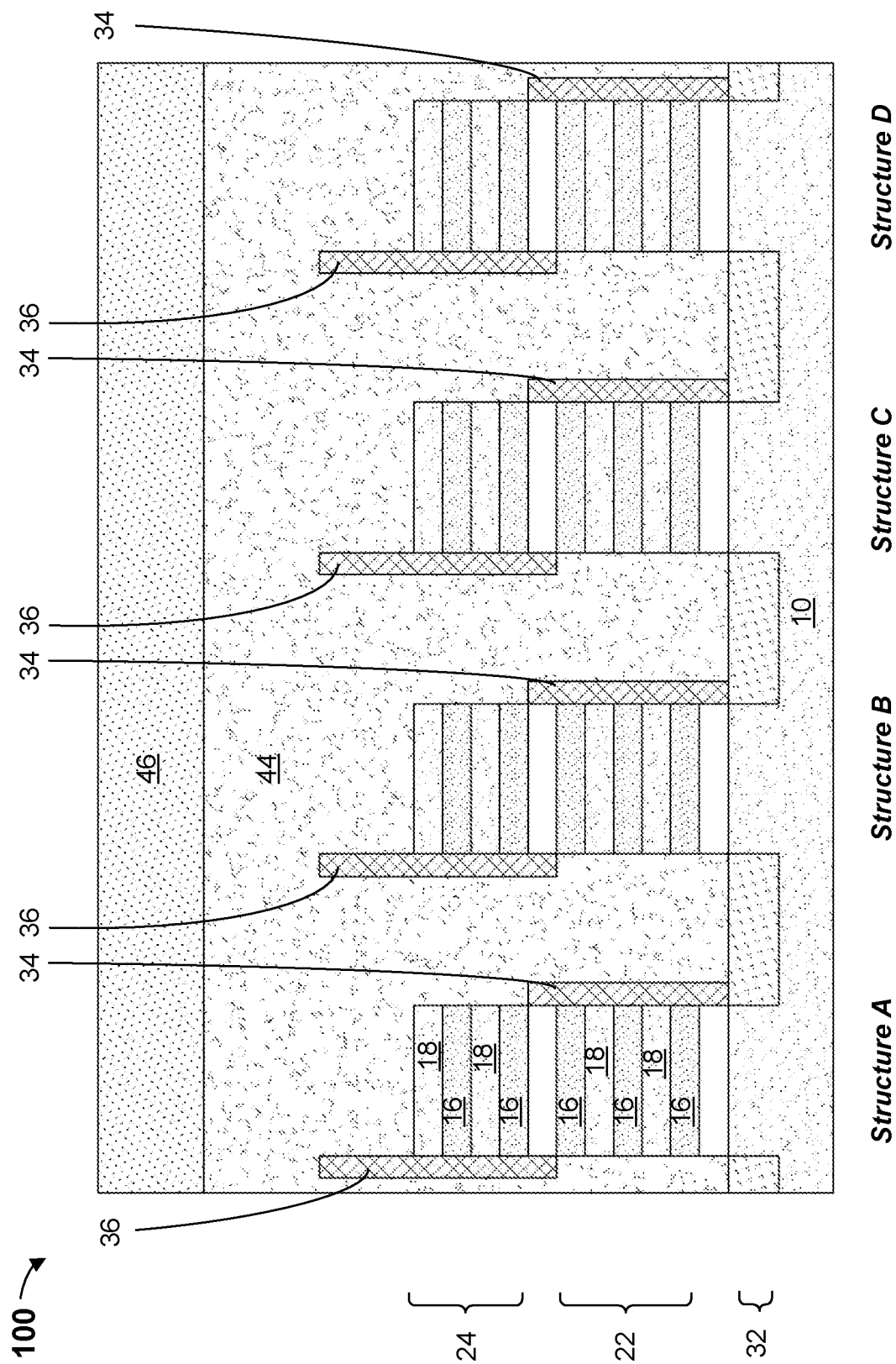
FIG. 5 illustrates a cross-sectional view of the semiconductor structure and illustrates removal of select silicon germanium layers, according to an exemplary embodiment.

Referring now to FIG. 5, the structure 100 is shown according to an exemplary embodiment. As shown in FIG. 5, the stack sacrificial layer 12 and the stack sacrificial layer 14 may be selectively removed using one or more known techniques.

The stack sacrificial layers 12, 14 are both removed selective to the sacrificial layers 16, the channel layers 18, the STI 32, the lower side spacer 34, the upper side spacer 36, the sacrificial gate 44 and the gate hard mask 46. For example, a dry etching technique can be used to selectively remove the stack sacrificial layers 12, 14, such as, for example, using vapor phased HCl dry etch.

Figure 6:
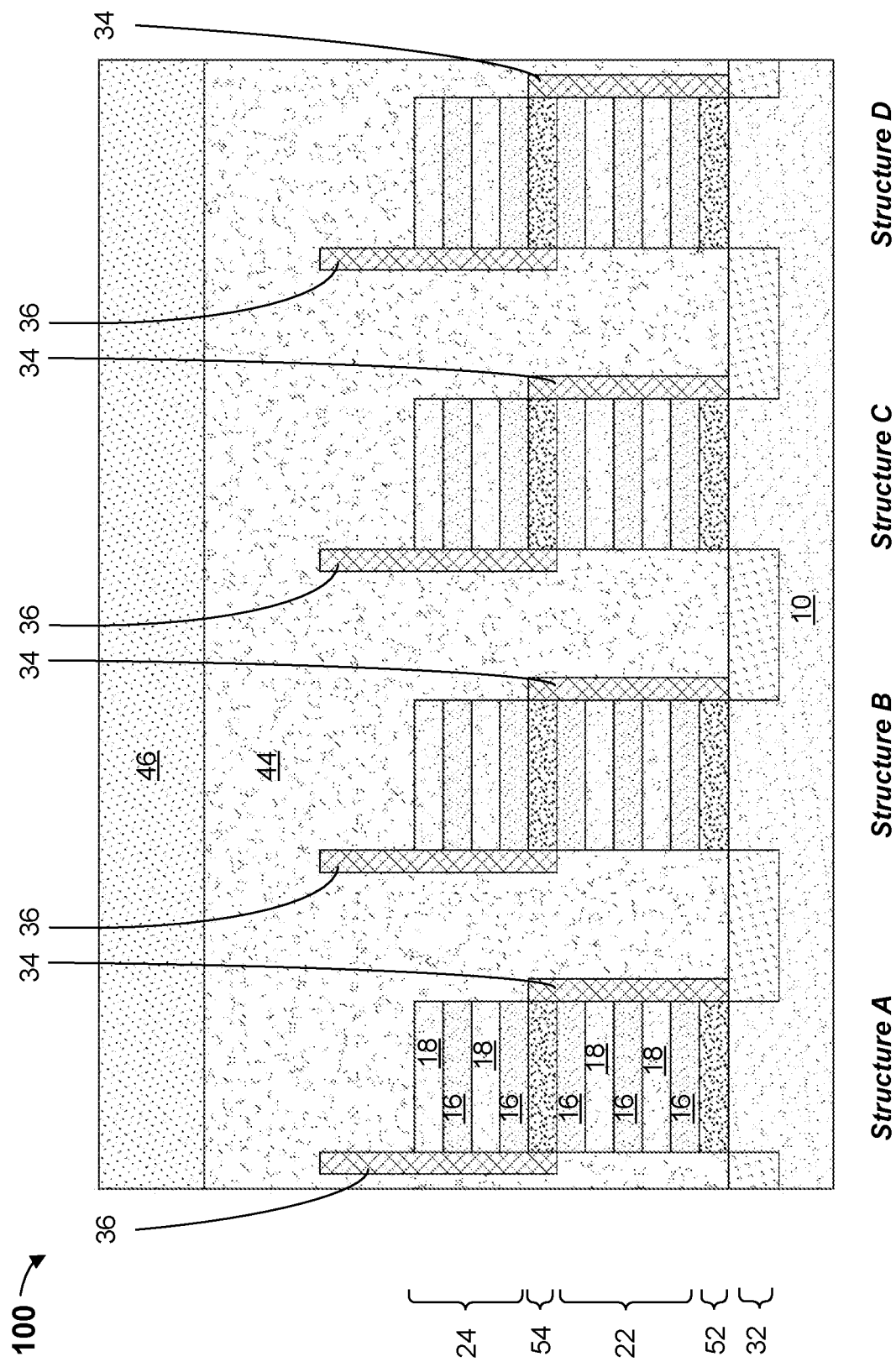
FIG. 6 illustrates a cross-sectional view of the semiconductor structure and illustrates formation of spacers, according to an exemplary embodiment.

Referring now to FIG. 6, the structure 100 is shown according to an exemplary embodiment. As shown in FIG. 6, a lower isolation 52 and an upper isolation 54 may be formed.

The lower isolation 52 may be formed where the stack sacrificial layer 12 has been removed. The lower isolation 52 may be formed between the lower nanosheet stack 22, the substrate 10, the lower side spacer 34 and the sacrificial gate 44. The upper isolation 54 may be formed where the stack sacrificial layer 14 has been removed. The upper isolation 54 may be formed between the lower nanosheet stack 22, the upper nanosheet stack 24, the lower side spacer 3 and, the upper side spacer 36.

The lower isolation 52 and the upper isolation 54 may each be formed after several processes, including for example, conformally depositing or growing a dielectric and performing an anisotropic etch process. The lower isolation 52 and the upper isolation 54 may include any dielectric material such as silicon nitride and may include a single layer or may include multiple layers of dielectric material. In an embodiment, the lower isolation 34 and the upper isolation 36 may be the same material.

Figure 7:
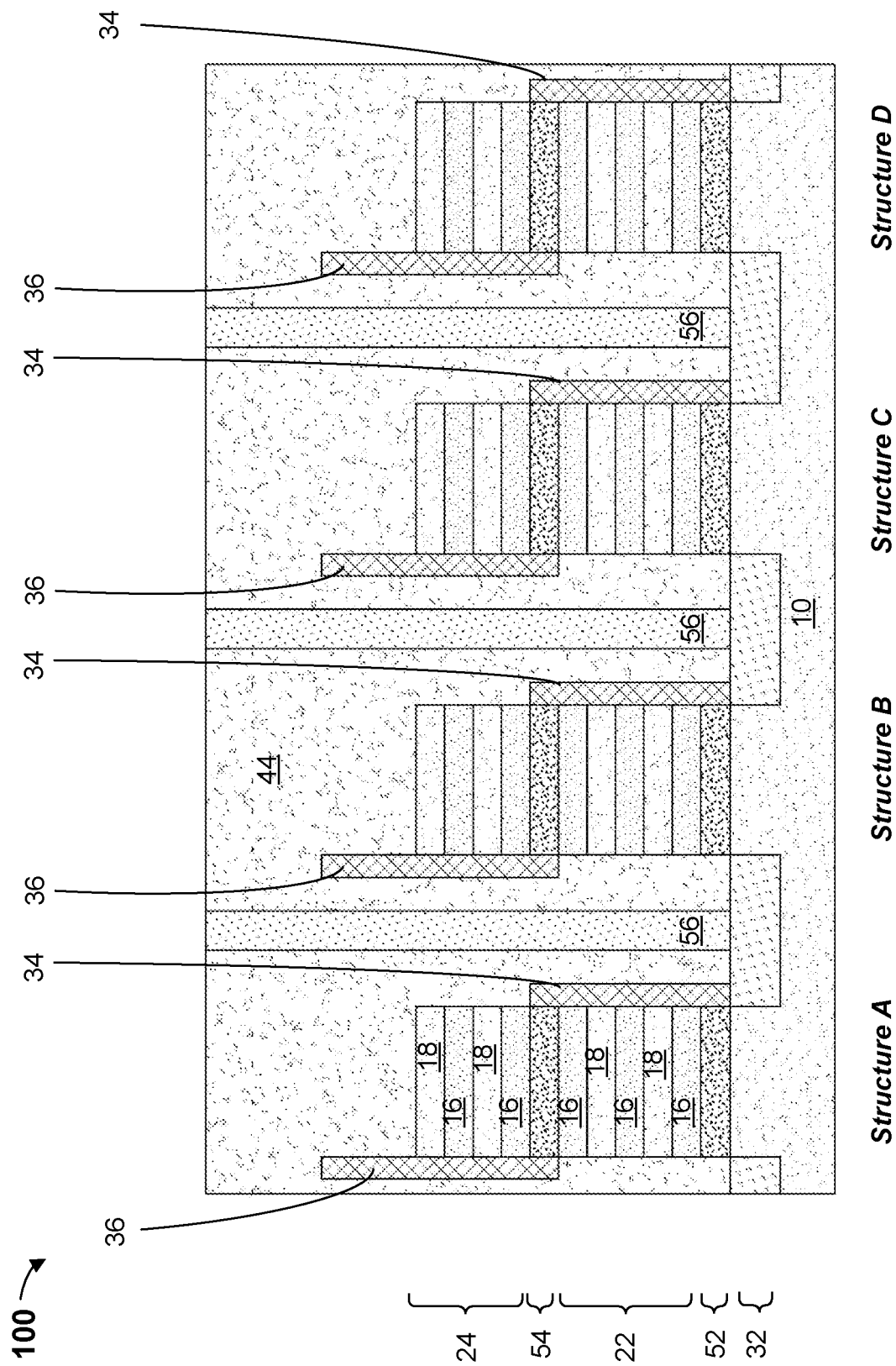
FIG. 7 illustrates a cross-sectional view of the semiconductor structure and illustrates formation of a vertical isolation region, according to an exemplary embodiment.

Referring now to FIG. 7, the structure 100 is shown according to an exemplary embodiment. As shown in FIG. 7, a gate isolation structure 56 may be formed between adjacent nanosheet stacks.

A vertical opening, not shown, may be made, removing a portion of the gate hard mask 46 and a portion of the sacrificial gate 44. The vertical opening may be etched using an anisotropic etching technique, such as, for example, reactive ion etching (RIE), and stopping at the STI 32 for subsequent formation of the gate isolation structure 56 between each nanosheet stack.

The gate isolation structure 56 may be formed in the vertical opening. The gate isolation structure 56 may be a dielectric material and may be formed using known patterning and deposition techniques. The Structures A, B, C, D are isolated from one another by the STI 32 and the gate isolation structure 56. After forming the gate isolation structure 56, the gate hard mask 46, may be removed, for example, by a wet etching technique as described above, followed by a chemical mechanical polishing (CMP) technique to remove excess material and polish upper surfaces of the structure 100.

Source/drain regions may be epitaxially grown in a region formed after removal of a vertical portion of the upper stack 24 and the lower stack 22 on opposite sides of the sacrificial gate 44. The source/drain regions are not visible in this portion of the structure 100. An upper source/drain region may be in direct contact with end portions of the channel layers 18 of the upper stack 24 and a lower source/drain region may be in direct contact with end portions of the channel layers 18 of the lower stack 22. The upper/source drain region may be isolated from the lower source/drain region by an isolation layer.

Figure 8:
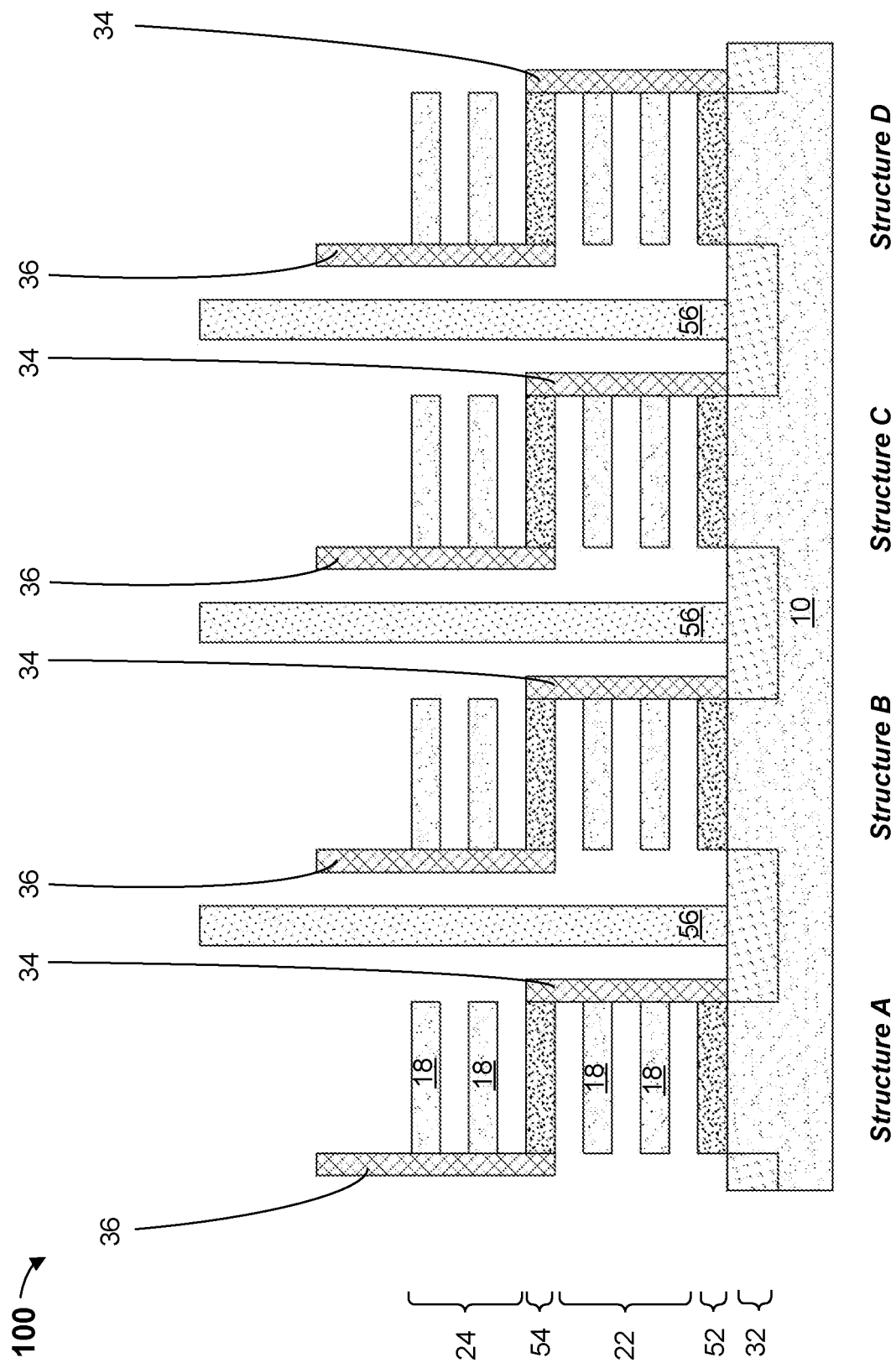
FIG. 8 illustrates a cross-sectional view of the semiconductor structure and illustrates selective removal of sacrificial semiconductor layers, according to an exemplary embodiment.

Referring now to FIG. 8, the structure 100 is shown according to an exemplary embodiment. As shown in FIG. 8, the sacrificial gate 44 and the sacrificial layers 16 are selectively removed via one or more steps according to techniques known in the art.

The sacrificial material layers 16 are removed selective to the channel layers 18, the lower isolation 52, the upper isolation 54, the lower side spacer 34, the upper side spacer 36, the gate isolation structure 56 and the STI 32. As illustrated in FIG. 8, the remaining channel layers 18 of the lower nanosheet stack 22 and of the upper nanosheet stack 24 are shown suspended and are supported on both ends by the upper and lower source/drain regions which are not shown. For example, a dry etch process can be used to selectively remove the sacrificial layer 16, such as using vapor phased HCl dry etch.

Figure 9:
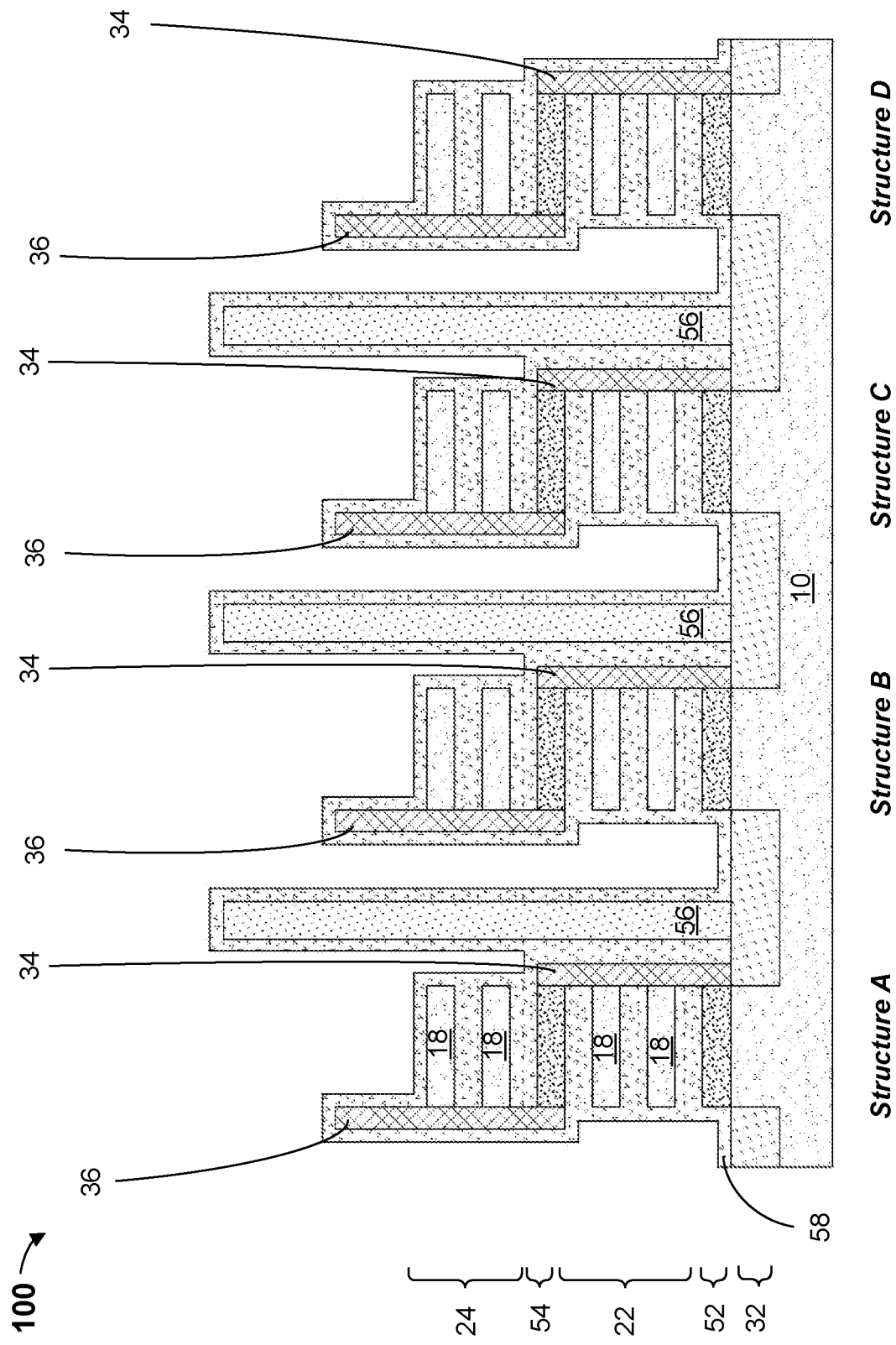
FIG. 9 illustrates a cross-sectional view of the semiconductor structure and illustrates formation of a first work function metal, according to an exemplary embodiment.

Referring now to FIG. 9, the structure 100 is shown according to an exemplary embodiment. As shown in FIG. 9, a first work function metal 58 (hereinafter "WFM") may be formed.

The first WFM 58 may be conformally formed on the structure 100, according to an exemplary embodiment. The first WFM 58 is formed in each cavity of the nanosheet stack and surrounding suspended portions of the channel layers 18. The first WFM 58 forms a layer surrounding exposed portions of the nanosheet stacks. The first WFM 58 may be cover an exposed portion of the STI 32, exposed surfaces of the gate isolation structure 56. The first WFM 58 may be directly adjacent to and fill a cavity between the lower side spacer 34 and the gate isolation structure 56 on the first side of the lower nanosheet stack 22. The first WFM 58 may cover exposed of the upper side spacer 36.

The first WFM 58 may be deposited using typical deposition techniques, for example, atomic layer deposition (ALD), molecular layer deposition (MLD), and chemical vapor deposition (CVD).

In an embodiment, the first WFM 58 may include more than one layer, for example, a conformal layer of a high-k material may be formed prior to the formation of the first WFM 58. The material chosen for the first WFM 58, and any high-k dielectric, may be selected based on a desired threshold voltage, in combination with other materials and properties as described above, for those memory cells where the first WFM 58 surrounds the channel layers 18, and whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiOxN_y$, $SrTiOxN_y$, $LaAlO_xN_y$, $Y_2O_xN_y$, SiON, SiNx, a silicate thereof, and an alloy thereof.

The material chosen for the first WFM 58, in combination with other materials and properties as described above, may determine a first threshold voltage, $VT_1$. At this point of fabrication $VT_1$ is the same for each of the eight memory cells in the structure 100.

Figure 10:
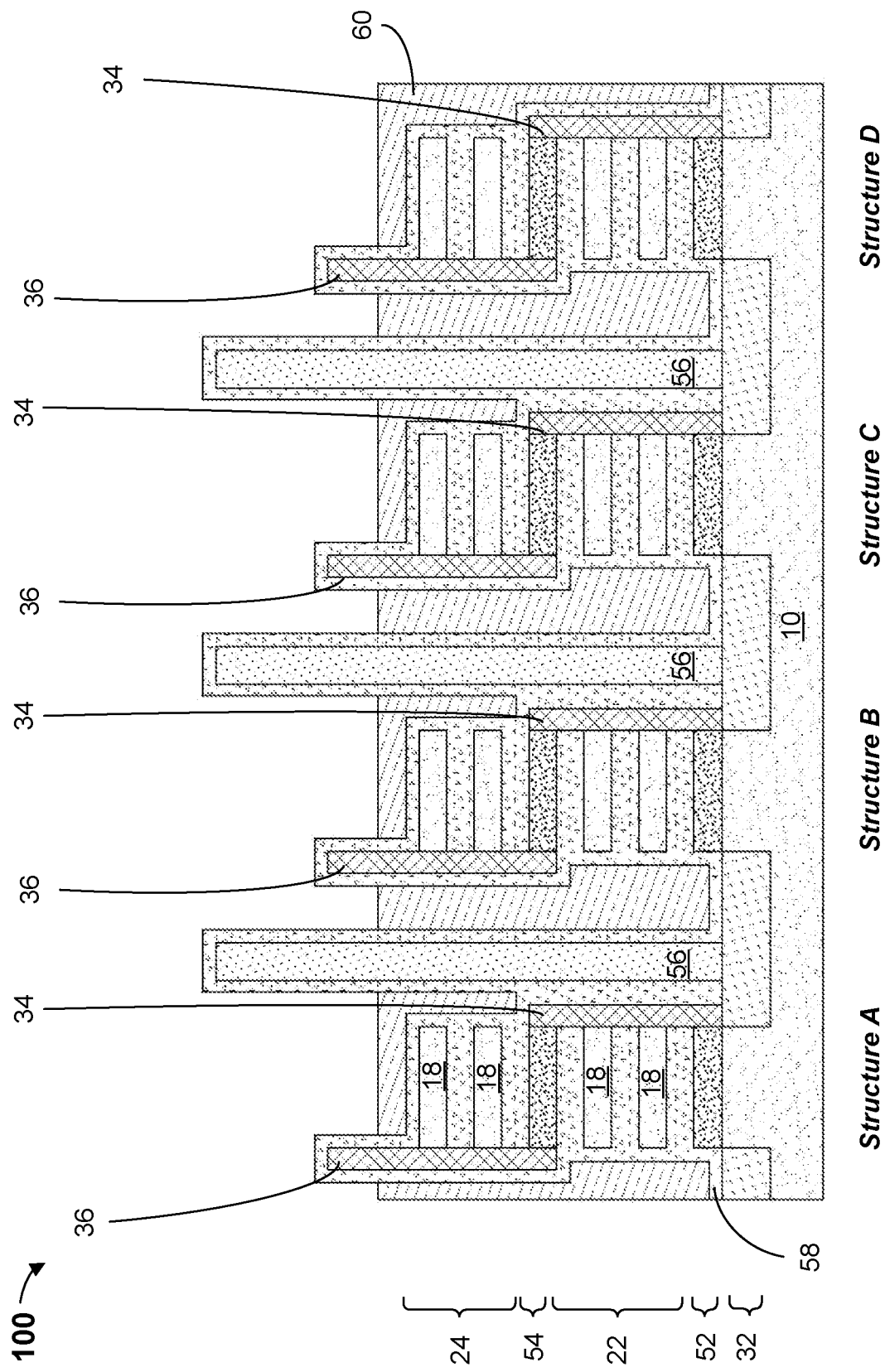
FIG. 10 illustrates a cross-sectional view of the semiconductor structure and illustrates formation of a first organic polymer layer, according to an exemplary embodiment.

Referring now to FIG. 10, the structure 100 is shown according to an exemplary embodiment. As shown in FIG. 10, a first organic polymer layer 60 (hereinafter "OPL") may be formed. The first OPL 60 may cover the nanosheet stacks in the Structures A, B, C, D.

The first OPL 60 may be formed by a blanket deposition using typical deposition techniques, for example spin-on coating. The first OPL 60 can be a self-planarizing organic material that includes carbon, hydrogen, oxygen, and optionally nitrogen, fluorine, and silicon. The first OPL 60 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A wet etching technique may be used to selectively remove portions of the first OPL 60 selective to the first WFM 58. An upper horizontal surface of the remaining first OPL 60 may be above an upper horizontal surface of the first WFM 58 above the nanosheet stack, allowing for subsequent formation of a mask and processing to selectively remove the first WFM 58 above the nanosheet stack in select nanosheet stacks. Portions of the WFM 58 remain exposed after recessing OPL 60 on exposed portions of the upper side spacer 36 and on exposed portions of the gate isolation structure 56.

Figure 11:
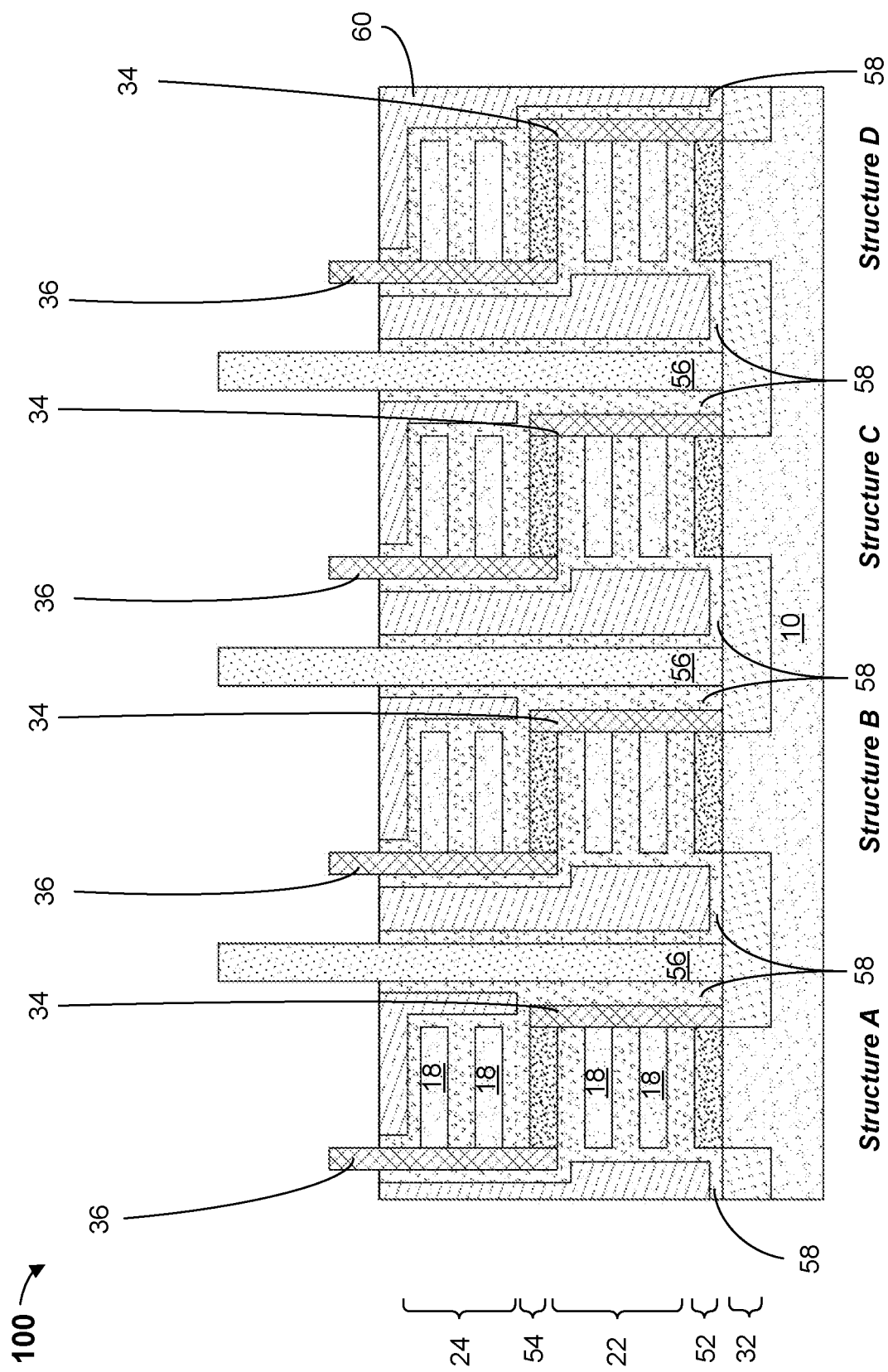
FIG. 11 illustrates a cross-sectional view of the semiconductor structure and illustrates removal of a portion of the work function metal, according to an exemplary embodiment.

Referring now to FIG. 11, the structure 100 is shown according to an exemplary embodiment. As shown in FIG. 11, exposed portions of the first WFM 58 may be removed.

A wet etching technique may be used to selectively remove portions of the first WFM 58, selective to the first OPL 60. An upper horizontal surface, and portions of a vertical side surfaces of the upper side spacer 36 may be exposed above an upper horizontal surface of the first OPL 60. An upper horizontal surface, and portions of a vertical side surfaces of the gate isolation structure 56 may be exposed above the upper horizontal surface of the first OPL 60.

At this point of fabrication, the Structures A, B, C, D are the same.

Figure 12:
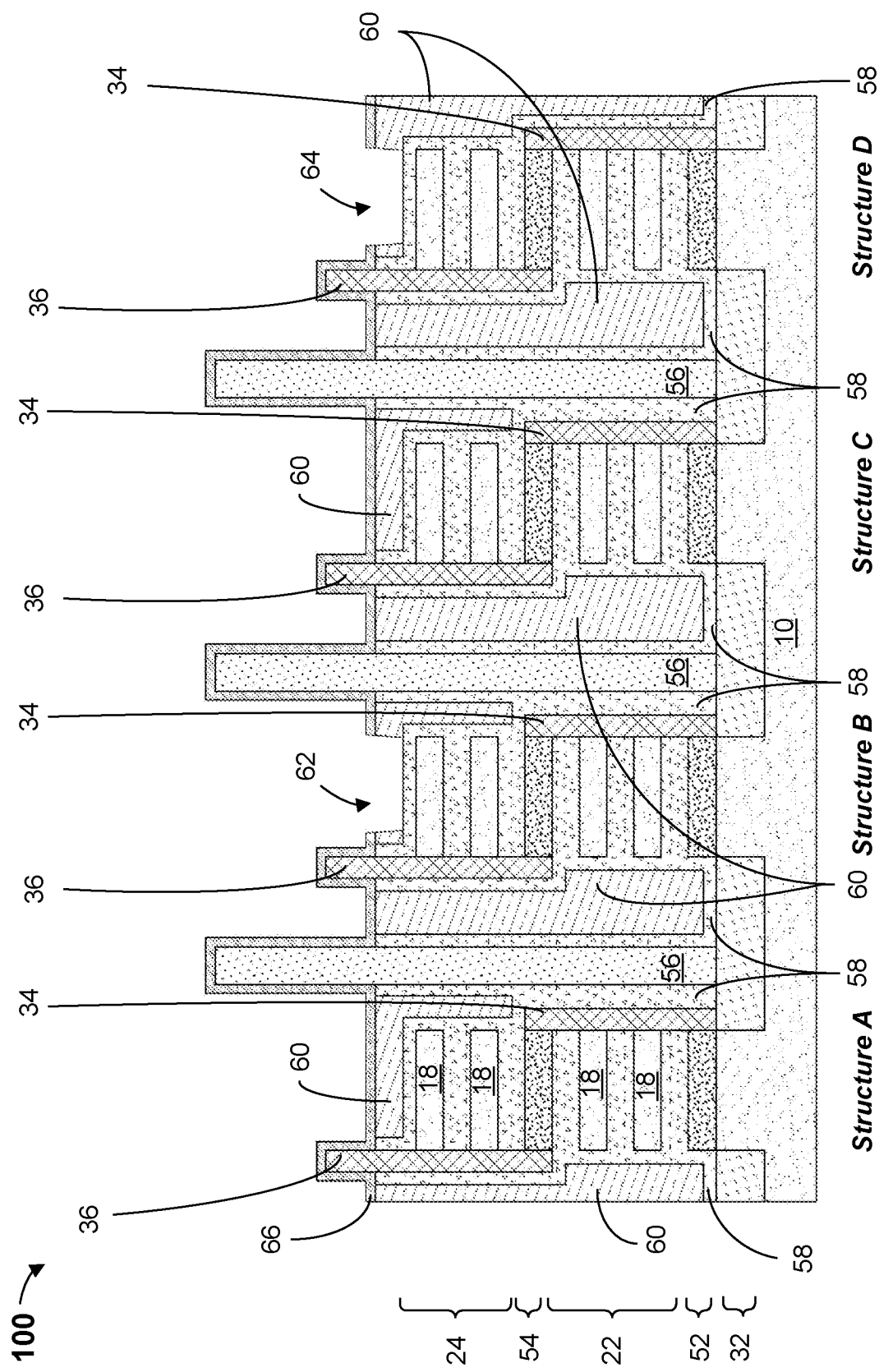
FIG. 12 illustrates a cross-sectional view of the semiconductor structure and illustrates formation of a first patterning layer and an opening, according to an exemplary embodiment.

Referring now to FIG. 12, the structure 100 is shown according to an exemplary embodiment. As shown in FIG. 12, an opening 62 and an opening 64 may be made in the structure 100.

A first patterning layer 66, may be formed on the structure 100. The first patterning layer 66 may be a blanket patterning layer on the upper horizontal surface, and exposed portions of the vertical side surfaces of the upper side spacer 36, on the upper horizontal surface, and exposed portions of the vertical side surfaces of the gate isolation structure 56, and on the upper horizontal surface of the first OPL 60.

The first patterning layer 66 may be composed of a photoresist material, such as, for example, a low temperature oxide layer (LTO) with a silicon containing anti-reflective coating (SiARC) layer formed thereon. The opening 62 and the opening 64 may be formed in the first patterning layer 66, and a portion of the first OPL 60 removed, exposing a portion of the first WFM 58 covering a top of the upper nanosheet stack 24 in the Structures B and D.

The opening 62 and the opening 64 may be formed using an anisotropic etching technique, such as, for example, reactive ion etching (RIE), and stopping on etching the first WFM 58.

At this point of fabrication, the Structures A and C are the same, the Structures B and D are the same, and the Structures A and C are different than the Structures B and D. Specifically, the Structures B and D each have an opening.

Figure 13:
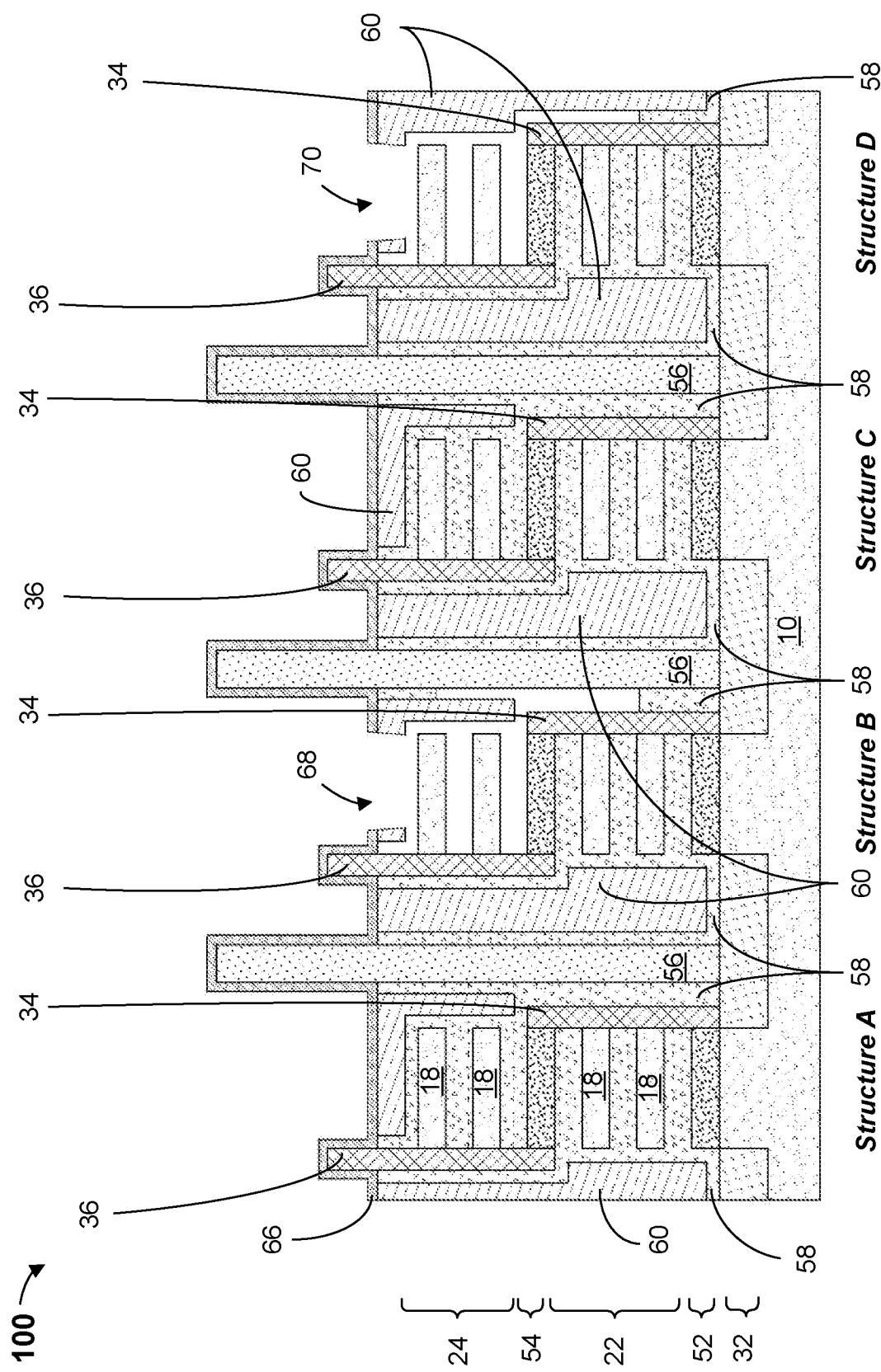
FIG. 13 illustrates a cross-sectional view of the semiconductor structure and illustrates removal of portions of the work function metal, according to an exemplary embodiment.

Referring now to FIG. 13, the structure 100 is shown according to an exemplary embodiment. As shown in FIG. 13, a portion of the first WFM 58 may be removed from the Structures B and D.

The opening 62 of FIG. 12 had an exposed portion of the first WFM 58 above the upper nanosheet 24 in the Structure B. The removal of the first WFM 58 is selective to the channel layer 18 of the upper nanosheet stack 24, selective to the upper isolation 54, selective to remaining portions of the first OPL 60 in a region of the upper nanosheet stack 24 in the Structure B. A remaining portion of the first WFM 58 remains between the lower side spacer 36 and the gate isolation structure 56. The opening 62 of FIG. 12 has increased to become opening 68 in the Structure B.

Similarly, the opening 64 of FIG. 12 had an exposed portion of the first WFM 58 above the upper nanosheet 24 in the Structure D. The removal of the first WFM 58 is selective to the channel layer 18 of the upper nanosheet stack 24, selective to the upper isolation 54, selective to remaining portions of the first OPL 60 in a region of the upper nanosheet stack 24 in the Structure D. A remaining portion of the first WFM 58 remains between the lower side spacer 36 and the gate isolation structure 56. The opening 64 of FIG. 12 has increased to become opening 70 in the Structure D.

The selective removal of the first WFM 58 may be performed by a wet etching technique as described above.

At this point of fabrication, the Structures A and C are the same, the Structures B and D are the same, and the Structures A and C are different than the Structures B and D. Specifically, the Structures B and D each have an opening.

Figure 14:
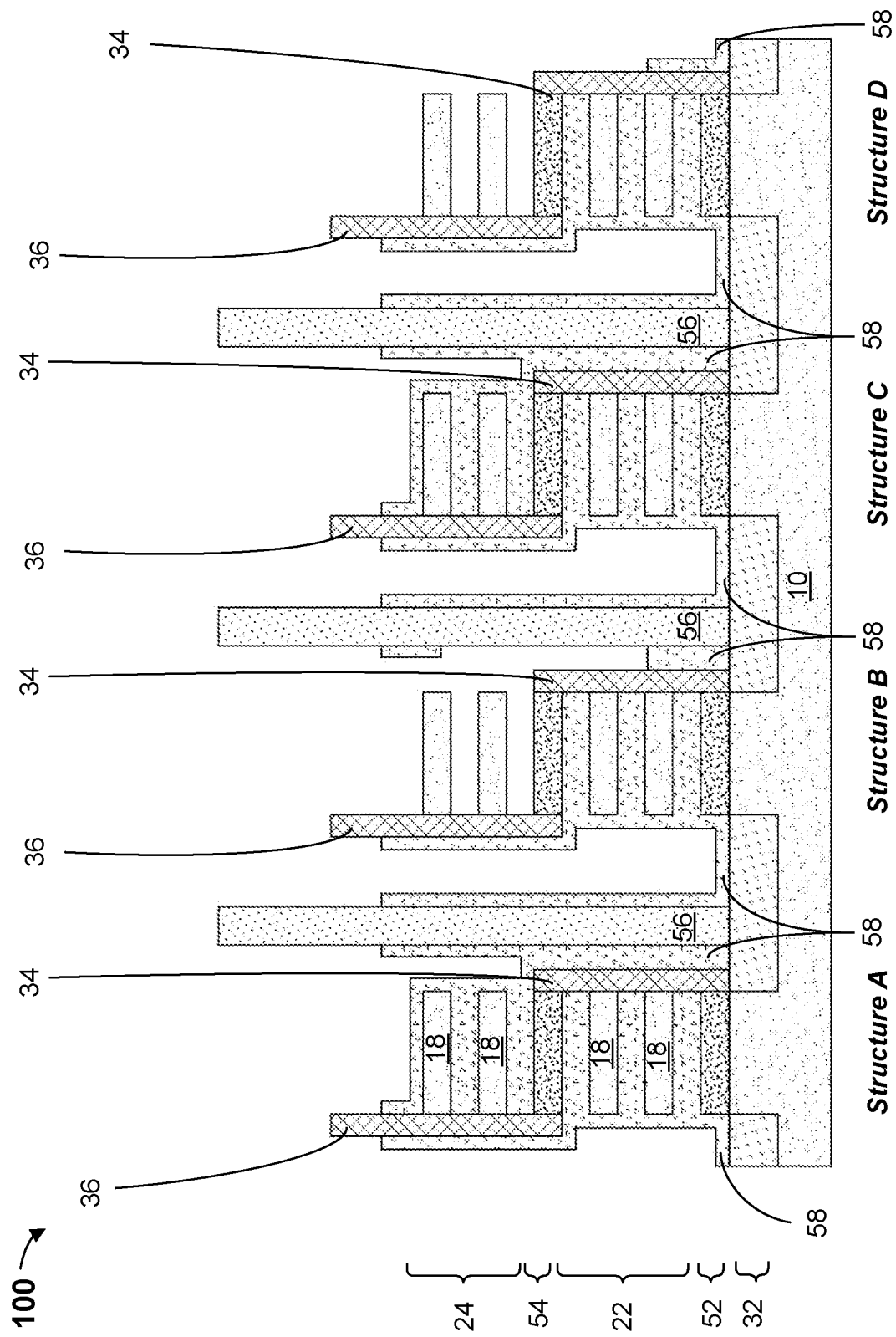
FIG. 14 illustrates a cross-sectional view of the semiconductor structure, and illustrates removal of the first patterning layer and removal of the first organic polymer layer, according to an exemplary embodiment.

Referring now to FIG. 14, the structure 100 is shown according to an exemplary embodiment. As shown in FIG. 14, remaining portions of the first patterning layer 66 and remaining portions of the first OPL 60 may be removed.

The removal of the first patterning layer 66 and the first OPL 60 may be performed by a wet etching technique as described above. The removal of the first patterning layer 66 and the first OPL 60 is selective to the gate isolation structure 56, the upper side spacer 36, the upper isolation 54, the channel layers 18, and the first WFM 58. Specifically, the first WFM 58 is in both the upper nanosheet stack 24 and the lower nanosheet stack 22 in the Structures A, C, and the first WFM 58 is in the lower nanosheet stack 22 in the Structures B, D. There is no first WFM 58 in the upper nanosheet stack 24 in the Structures B, D.

At this point of fabrication, the Structures A and C are the same, the Structures B and D are the same, and the Structures A and C are different than the Structures B and D. Specifically, the Structures B and D do not have a work function metal in the upper nanosheet stack 24.

Figure 15:
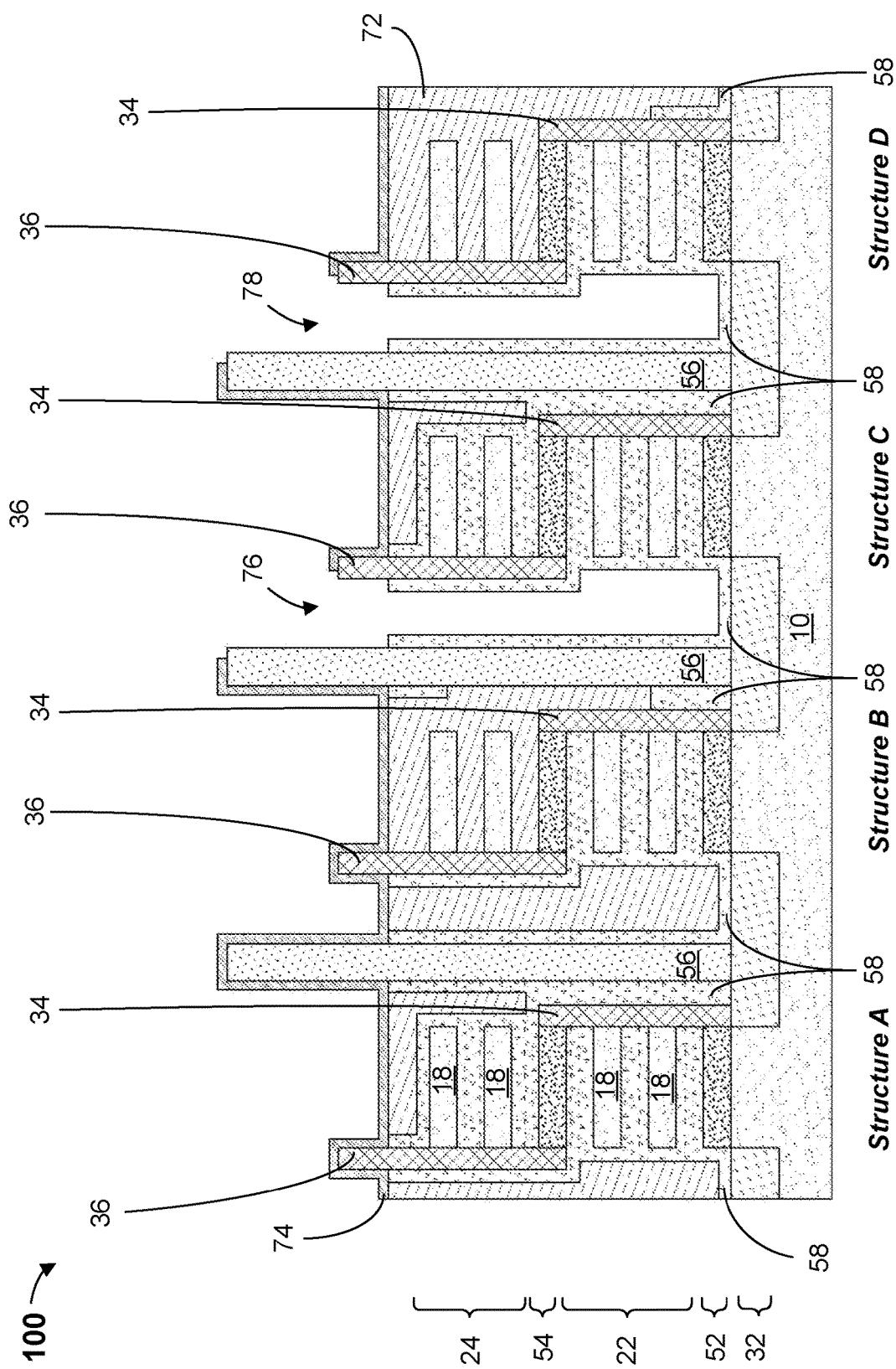
FIG. 15 illustrates a cross-sectional view of the semiconductor structure, and illustrates formation of a second organic polymer layer, formation of a second patterning layer and formation of two openings, according to an exemplary embodiment.

Referring now to FIG. 15, the structure 100 is shown according to an exemplary embodiment. As shown in FIG. 15, a second organic patterning layer 72 (hereinafter "OPL") may be formed, a second patterning layer 74 may be formed, and openings 76 and 78 may be formed.

The second OPL 72 may be formed on the structure 100 as described above regarding the first OPL 60 as shown in FIG. 10, by a blanket deposition and selective etching to remove portions of the second OPL 72 selective to a portion of the upper side spacer 36, a portion of the gate isolation structure 56 and the first WFM 58. An upper horizontal surface of the second OPL 72 may be above an upper horizontal surface of the first WFM 58 above the nanosheet stack, allowing for subsequent patterning and processing. Exposed portions of the upper side spacer 36 and the gate isolation structure 56 may be above the upper horizontal surface of the second OPL 72.

A second patterning layer 74, may be formed on the structure 100 as described above regarding the first patterning layer 66 shown in FIG. 11. The second patterning layer 74 may be a blanket patterning layer on the exposed portions of the upper side spacer 36 and the gate isolation structure 56, and on the upper horizontal surface of the second OPL 72.

The opening 76 and the opening 78 may be formed in the second patterning layer 74, and a portion of the second OPL 72 removed, similar to the description above and as shown in FIG. 12. A portion of the first WFM 58 may be exposed between the gate isolation structure 56 and surrounding the lower nanosheet stack 22 in the Structures C and D.

At this point of fabrication, the Structures A, B, C and D are each different.

Figure 16:
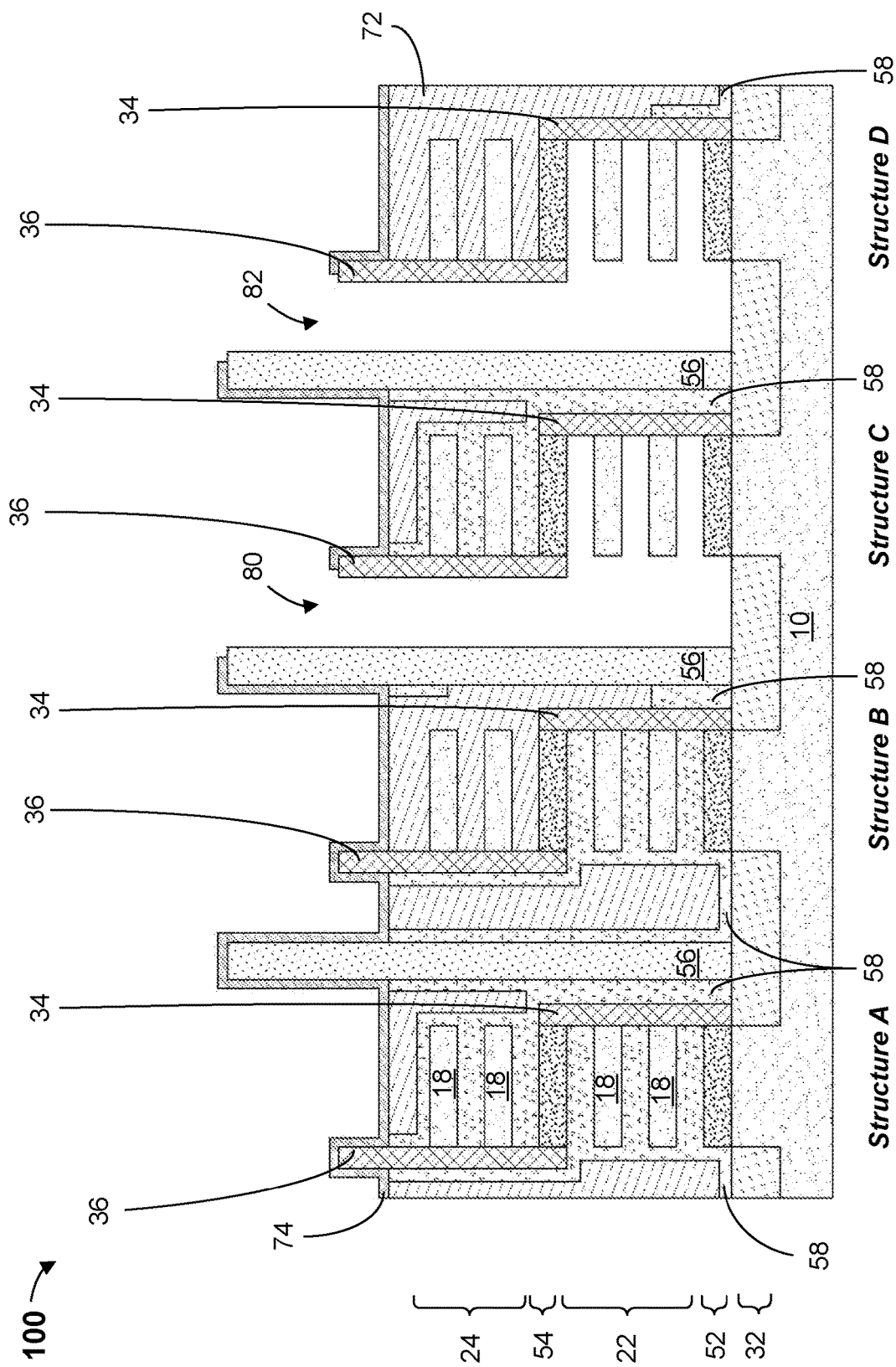
FIG. 16 illustrates a cross-sectional view of the semiconductor structure and illustrates removal of portions of the work function metal, according to an exemplary embodiment.

Referring now to FIG. 16, the structure 100 is shown according to an exemplary embodiment. As shown in FIG. 16, a portion of the first WFM 58 may be removed from the Structures C and D. The selective removal of the first WFM 58 may be performed by a wet etching technique as described above.

The opening 76 of the FIG. 15 had an exposed portion of the first WFM 58 exposed in the lower nanosheet stack 22 in the Structure C, while the opening 78 of the FIG. 15 had an exposed portion of the first WFM 58 exposed in the lower nanosheet stack 22 in the Structure D. Removal of the exposed first WFM 58 increases each of the openings 76, 78, as described above in FIG. 13. The removal of the first WFM 58 in the Structure C forms an opening 80. The removal of the first WFM 58 in the Structure D forms an opening 82. The removal of the first WFM 58 is selective to the channel layer 18 of the lower nanosheet stack 22, the lower isolation 52, the upper isolation 54, the upper side spacer 36 and the gate isolation structure 56, in a region of the lower nanosheet stack 22 in both the Structures C and D.

At this point of fabrication, the Structures A, B, C and D are different.

Figure 17:
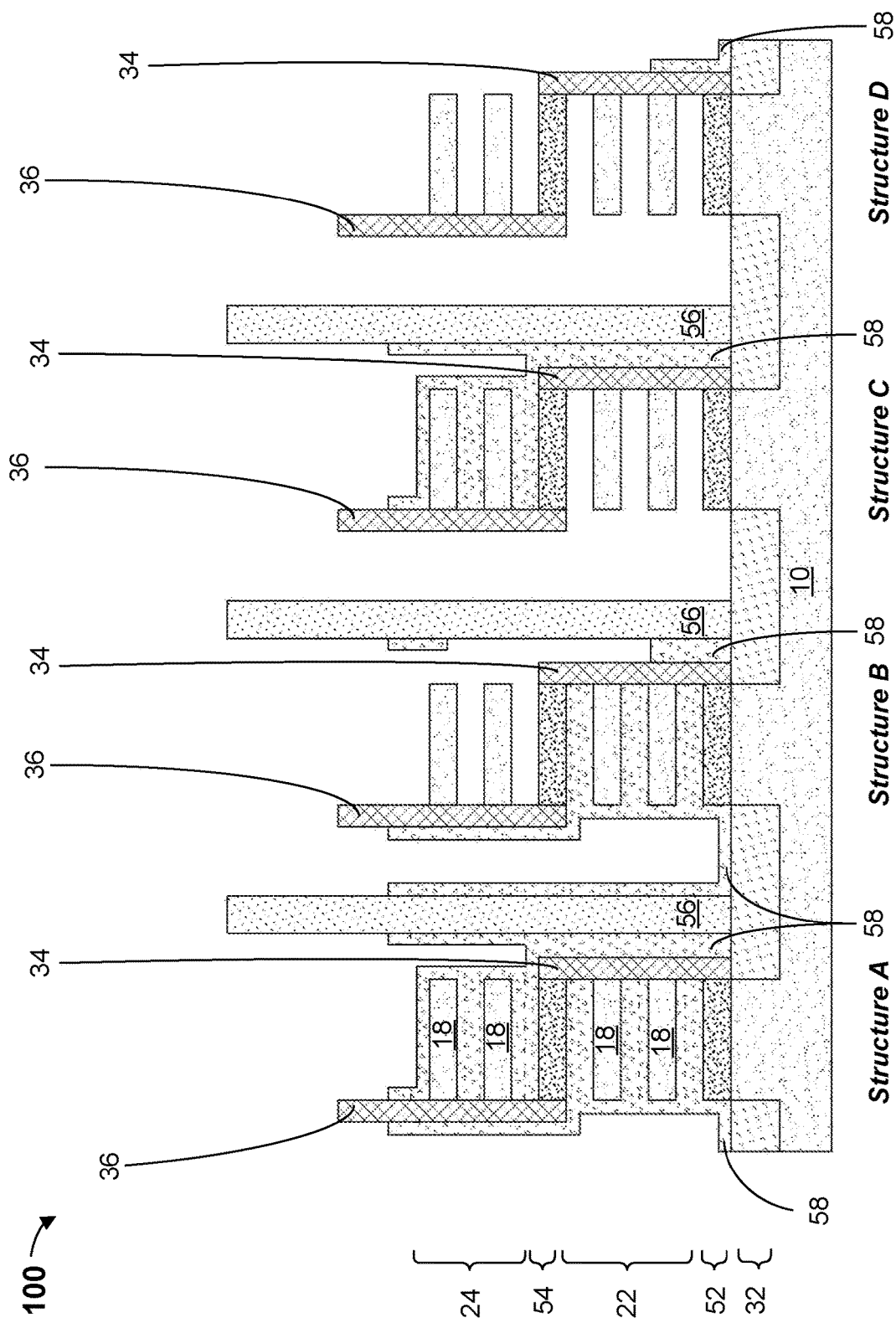
FIG. 17 illustrates a cross-sectional view of the semiconductor structure, and illustrates removal of the second patterning layer and removal of the second organic polymer layer, according to an exemplary embodiment.

Referring now to FIG. 17, the structure 100 is shown according to an exemplary embodiment. As shown in FIG. 17, the second patterning layer 74 and the second OPL 72 may be removed.

The removal of the second patterning layer 74 and the second OPL 72 may be performed by a wet etching technique as described above, similar to FIG. 14. The removal of the second patterning layer 74 and the second OPL 72 is selective to the gate isolation structure 56, the upper side spacer 36, lower side spacer 34, the upper isolation 54, the lower isolation 52, the channel layers 18, and the first WFM 58.

Specifically, the first WFM 58 remains in both the upper nanosheet stack 24 and the lower nanosheet stack 22 in the Structure A. The first WFM 58 remains in the lower nanosheet stack 22 in the Structure B. The first WFM 58 remains in the upper nanosheet stack 24 in the Structure C. The first WFM 58 does not remain in the Structure D. There may be residual portions of the first WFM 58 along the gate isolation structure 56, which does not adversely affect operation of the memory cells.

At this point of fabrication, the Structures A, B, C and D are different.

Figure 18:
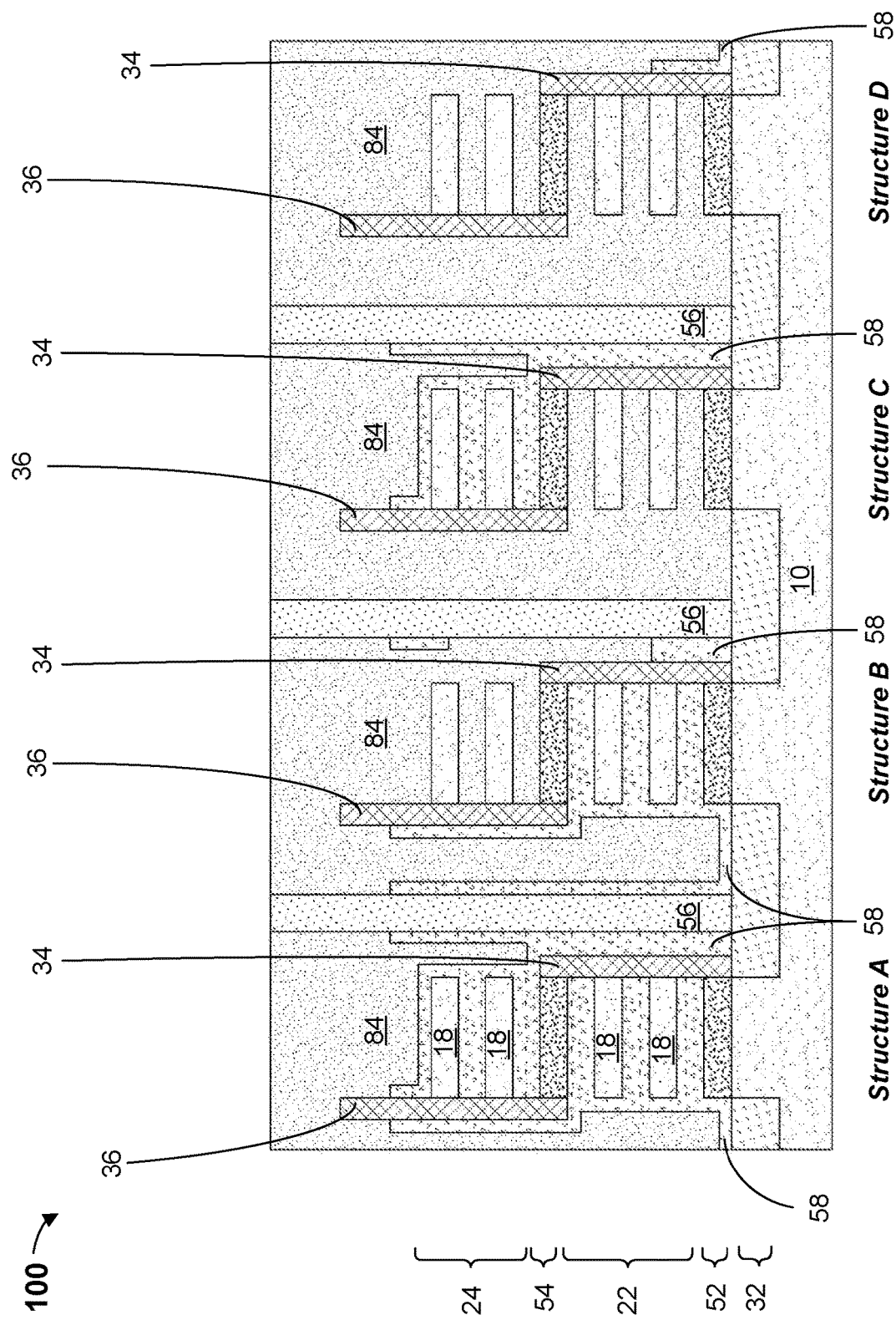
FIG. 18 illustrates a cross-sectional view of the semiconductor structure and illustrates formation of a second work function metal, according to an exemplary embodiment.

Referring now to FIG. 18, the structure 100 is shown according to an exemplary embodiment. As shown in FIG. 18, a second work function metal 84 (hereinafter "WFM") may be formed.

The second WFM 84 may be conformally formed on the structure 100, as described above and shown in FIG. 9. The second WFM 84 is formed in each exposed cavity of the nanosheet stacks and surrounding exposed suspended portions of the channel layers 18.

Specifically, the second WFM 84 is formed surrounding suspended portions of the channel layers 18 in the upper stack 24 of Structure B, in the lower stack 22 of Structure C and in both the upper stack 24 and the lower stack 22 of Structure D. The second WFM 84 also fills openings in the structure 100, including surrounding the first WFM 58, the gate isolation structure 56, the upper isolation 54, the lower isolation 52, the upper side spacer 36, the lower side spacer 34, and the STI 32.

As described above, the material chosen for the second WFM 84, in combination with other materials and properties as described above, may be selected based on an applicable threshold voltage desired for those memory cells where the second WFM 84 surrounds the channel layers 18, and whether the device is a p-FET or n-FET. In an embodiment, the second WFM 84 may include more than one layer, for example, a conformal layer of a high-k material may be formed prior to the formation of the second WFM 84, also described above.

The material used for the second WFM 84, in combination with other materials and properties as described above, may determine a second threshold voltage, $VT_2$ which may be different than $VT_1$, for those memory cells of the structure 100 which include the second WFM 84 directly surrounding the channel layers 18. In at least one embodiment, all other materials and properties of the memory cells may be the same, and the different work function metals will determine different threshold voltages.

The material used for the first WFM 58 and the second WFM 84 determine a programmed value of either a first memory state or a second memory state for each of the eight memory cells of the structure 100.

Figure 19:
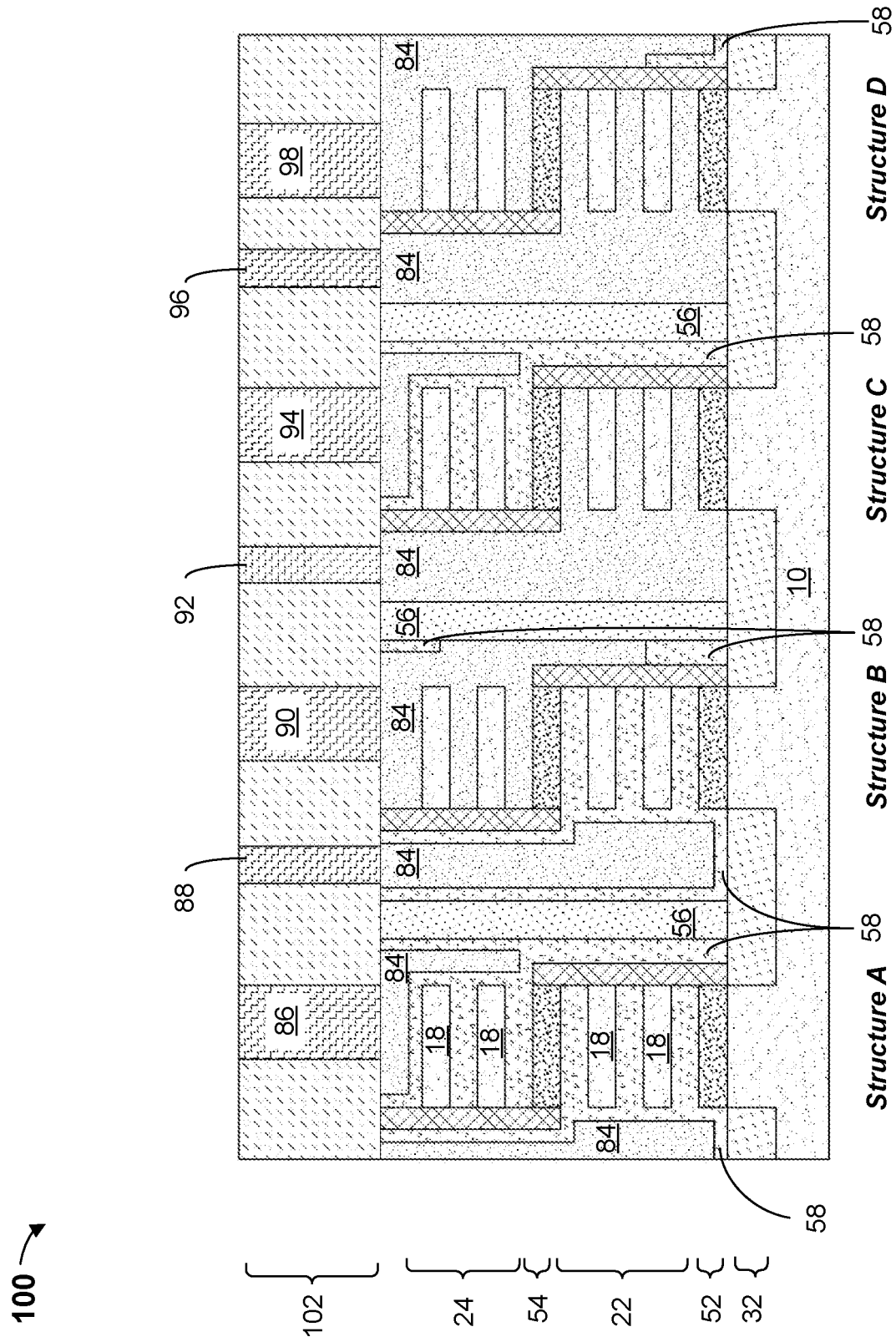
FIG. 19 illustrates a cross-sectional view of the semiconductor structure and illustrates formation of contacts, according to an exemplary embodiment.

Referring now to FIG. 19, the structure 100 is shown according to an exemplary embodiment. As shown in FIG. 19, a dielectric layer 102 and contacts 86, 88, 90, 92, 94, 96, 98 may be formed in openings (not shown) in the dielectric layer.

The dielectric layer 102 may be conformally formed as described above and form a blanket deposition on the structure 100. The dielectric layer 102 may be formed and then a chemical mechanical polishing (CMP) technique may be used to remove excess material and polish upper surfaces of the structure 100.

A photo resist mask (not shown) may be used to protect the dielectric layer 102 and the photo resist mask may have a space which allows the openings to be formed during recessing/etching. The opening may be formed using an anisotropic vertical etch process such as a reactive ion etch (RIE), or any suitable etch process. The openings may be formed in one or more process steps. The photo resist mask may be removed subsequently. Side surfaces of the dielectric layer 102 will be exposed and upper surfaces of the WFM 84 will be exposed at a bottom of the openings. The contacts 86, 88, 90, 92, 94, 96, 98 may be deposited in each opening using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). The contacts 86, 88, 90, 92, 94, 96, 98 may then be may be polished using a chemical mechanical polishing (CMP) technique to remove excess material and polish upper surfaces of the structure 100 until top surfaces of contacts 86, 88, 90, 92, 94, 96, 98 are substantially coplanar with a top surface of the dielectric layer 102.

The contacts 86, 88, 90, 92, 94, 96, 98 may be made from any known metal, such as, for example, Al, W, Cu, Co, Zr, Ta, Hf, Ti, Ru, Pa, metal oxide, metal carbide, metal nitride, transition metal aluminides (e.g. $Ti_3Al$, ZrAl), TaC, TiC, TaMgC, and any combination of those materials. The contacts 86, 88, 90, 92, 94, 96, 98 may have one or more layers. In an embodiment, the contacts 86, 88, 90, 92, 94, 96, 98 may have a bottom layer of Ti or TiN and a top layer of Ti or Cu. The contacts 86, 88, 90, 92, 94, 96, 98 may have an upper horizontal surface which is substantially coplanar with an upper horizontal surface of the dielectric layer 102.

The contacts 86, 88, 90, 92, 94, 96, 98 may provide an electrical contact to a gate of the structure 100 by providing contact directly to the second WFM 84, and indirectly the first WFM 58. The first WFM 58 and the second WFM 84 provide a wrap around gate for the channels of the nanosheet transistor. The contacts 86, 88, 90, 92, 94, 96, 98 each provide a contact to the wrap around gate of a nanosheet stack.

The contact 86 is a gate contact to the upper nanosheet stack 24 of the Structure A, connecting to the second WFM 84 which is connected to the first WFM 58 surrounding the channel layers 18 of the upper nanosheet stack 24 of the Structure A. Although not shown in the figures, the lower nanosheet stack 22 of the Structure A will also have a gate contact.

The contact 88 is a gate contact to the lower nanosheet stack 22 of the Structure B, connecting to the second WFM 84 which is connected to the first WFM 58 surrounding the channel layers 18 of the lower nanosheet stack 22 of the Structure B.

The contact 90 is a gate contact to the upper nanosheet stack 24 of the Structure B, connecting to the second WFM 84 surrounding the channel layers 18 of the upper nanosheet stack 24 of the Structure B.

The contact 92 is a gate contact to the lower nanosheet stack 22 of the Structure C, connecting to the second WFM 84 surrounding the channel layers 18 of the lower nanosheet stack 22 of the Structure C.

The contact 94 is a gate contact to the upper nanosheet stack 24 of the Structure C, connecting to the second WFM 84 which is connected to the first WFM 58 surrounding the channel layers 18 of the upper nanosheet stack 24 of the Structure C.

The contact 96 is a gate contact to the lower nanosheet stack 22 of the Structure D, connecting to the second WFM 84 surrounding the channel layers 18 of the lower nanosheet stack 22 of the Structure D.

The contact 98 is a gate contact to the upper nanosheet stack 24 of the Structure D, connecting to the second WFM 84 surrounding the channel layers 18 of the upper nanosheet stack 24 of the Structure D.

A portion of the structure 100 may be removed using a chemical mechanical polishing (CMP) technique to remove excess material and polish upper surfaces of the structure 100.

The material used for the first WFM 58 and the second WFM 84 determine a programmed value of either a first memory state or a second memory state for each of the eight memory cells of the structure 100.

Using this method of programming each memory cell of the structure 100 by selection of a work function metal used in each of the nanosheet stacks, each of the upper nanosheet stack 24 and the lower nanosheet stack 22, can be used as a non-volatile memory or ROM.

As described above, programming of each ROM memory cell may be done during device fabrication by utilizing a different work function metal for different memory states, which results in different threshold voltages. A memory state may be "read" based on a memory cell being turned "on" or "off" at a read voltage which is in between the different threshold voltage values.

In an embodiment, $VT_2$ may be less than $VT_1$. A read voltage between $VT_2$ and $VT_1$ may be applied to the memory cells of the structure 100. When the read voltage is applied, those memory cells with the second WFM 84 may be turned on and those memory cells with the first WFM 58 may not be turned on.

The Structure A has both the channel layers 18 of the upper nanosheet stack 24 and of the lower nanosheet stack 22 surrounded by the first WFM 58. Specifically, both the upper and lower nanosheet stacks 22, 24 of the Structure A may be off at the read voltage and may be in a first memory state.

The Structure B has the channel layers 18 of the upper nanosheet stack 24 surrounded by the second WFM 84 and the channel layers 18 of the lower nanosheet stack 22 surrounded by the first WFM 58. Thus, the lower nanosheet stack 22 is off, resulting in the first memory state, while the upper nanosheet stack 24 is on, resulting in a second memory state, when the read voltage is applied to the gate.

The Structure C has the channel layers 18 of the upper nanosheet stack 24 surrounded by the first WFM 58 and the channel layers 18 of the lower nanosheet stack 22 surrounded by the second WFM 84. The lower nanosheet stack 22 on, resulting in the second memory state, while the upper nanosheet stack 24 is off, resulting in the first memory state, when the read voltage is applied to the gate.

The Structure D has the channel layers 18 of the upper nanosheet stack 24 and of the lower nanosheet stack 22 surrounded by the second WFM 84. Both the upper and lower nanosheet stacks 22, 24 are off at the read voltage and may each be in the second memory state, when the read voltage is applied to the gate.

In an alternate embodiment, a single gate contact may be formed in direct contact with the gates of both the upper nanosheet stack 24 and the lower nanosheet stack 22, for each of the Structure A, B, C, D. For example, contacts 88, 90 of Structure B may be fabricated as a single structure directly contacting the second WFM 84 on opposite sides of the Structure B. Similarly, source/drain regions of the upper nanosheet stack 24 may be connected to source/drain regions of the lower nanosheet stack 22 of each Structure A, B, C, D. Each Structure A, B, C, D is isolated from the other. In this embodiment, each of the Structures A, B, C, D may have one of three memory states. As previously described, memory cells with the first WFM 58 surrounding the channel layers 18 have $VT_1$ and those memory cells with the second WFM 84 surrounding the channel layers 18 have $VT_2$. For example, if $VT_1 > VT_2$, a voltage V1 may be applied to the single gate contact for each of the Structures A, B, C, D, where $VT_1 > V1 > VT_2$.

When, for example, V1 is applied to the single gate contact of the Structure A, both the lower and upper nanosheet stacks 22, 24 will be off. This will result in a low flow of current across the combined source/drain of the Structure A. In such cases, the Structure A may be characterized as having a first memory state of the three memory states.

When, for example, V1 is applied to the single gate contact of Structure B, the lower nanosheet stack 22 is off, while the upper nanosheet stack 24 is on. This will result in a medium flow of current across the combined source/drain of Structure B. In such cases, the Structure B may be characterized as having a second memory state of the three memory states.

When, for example, V1 is applied to the single gate contact of Structure C, the lower nanosheet stack 22 is on, while the upper nanosheet stack 24 is off. This will result in a medium flow of current across the combined source/drain of the Structure C. In such cases, the Structure C may be characterized as having the second memory state of the three memory states.

When, for example, V1 is applied to the single gate contact of Structure D, both the lower and the upper nanosheet stacks 22, 24 are on. This will result in a high flow of current across the combined source/drain of the Structure D. In such cases, the Structure D may be characterized as having a third memory state of the three memory states.

In this embodiment, the Structures A, B, C, D may each be a memory cell which is hard programmed during manufacturing by a threshold voltage of a work function metal used in each of the upper nanosheet stack 24 and the lower nanosheet stack 22 and each can be used as a ROM which stores one of three memory states.

An array of the Structures A, B, C, D may be arranged in any order and may provide hard programming of ROM memory cells. Arrangement of the Structures A, B, C, D is dependent upon desired programming of each memory cell. Word lines and bit lines may connect the Structures A, B, C, D to provide read access to the memory cells.

Figure 20A:
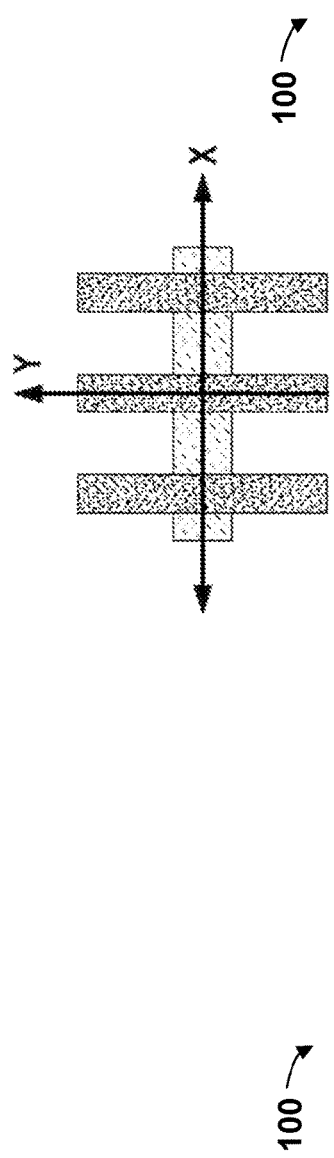
FIGS. 20A, 20B and 20C each illustrate a view of the semiconductor structure.
Figure 20C:
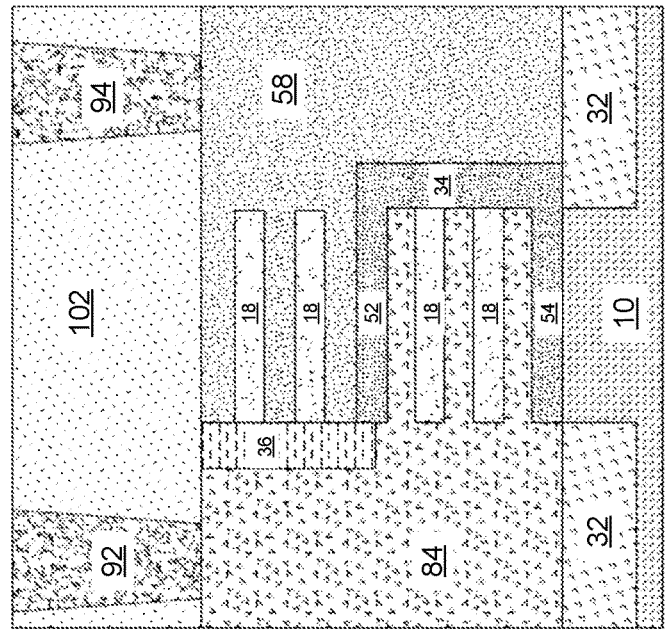
Figure 20B:
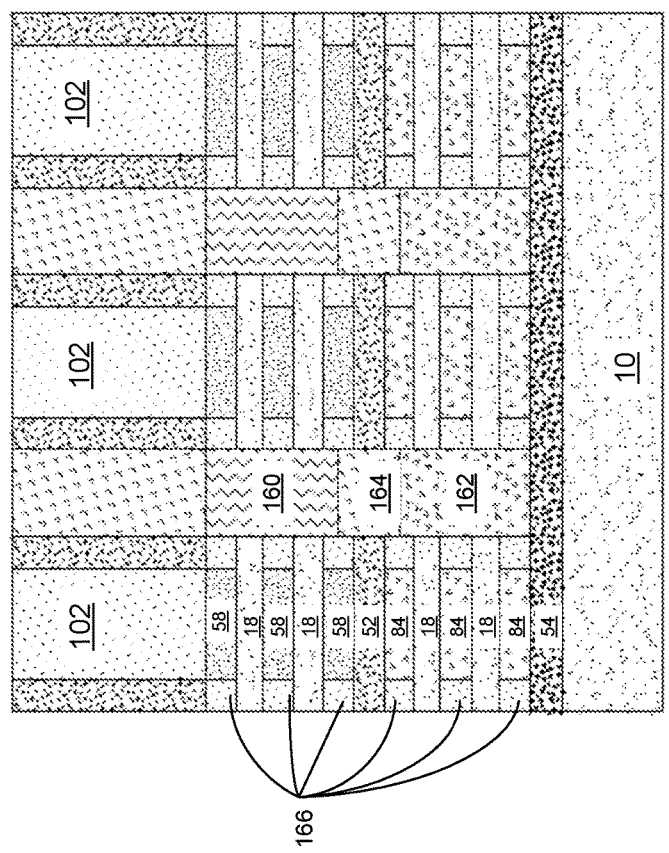

Referring now to FIGS. 20A, 20B and 20C, the structure 100 is shown according to an exemplary embodiment. FIG. 20A is an overhead view. FIG. 20B is a cross section along section line X-X of FIG. 20A. FIG. 20C is the Structure C as shown in FIG. 19 and is a cross section along section line Y-Y of FIG. 20A and is perpendicular to the cross-sectional view of the FIG. 20B.

FIG. 20B illustrates three nanosheet stacks parallel to each other, with an upper source drain region 160 separated by an isolation dielectric 164 from a lower source drain region 162 between each nanosheet stack. Each of the nanosheet stacks are the Structure C, with the lower nanosheet stack 22 including the second WFM 84 surrounding the channel layers 18 and the upper nanosheet stack 24 including the first WFM 58 surrounding the channel layers 18, according to an exemplary embodiment. A liner 166 surrounds outer edges of the first WFM 58 within the upper nanosheet stack 24, and also surround outer edges of the second WFM 84 within the lower nanosheet stack 22.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
    a first nanosheet stack comprising two memory cells, the first nanosheet stack comprising:
        a lower nanosheet stack on a substrate comprising alternating layers of a first work function metal and a semiconductor channel material vertically aligned and stacked one on top of another; and
        an upper nanosheet stack comprising alternating layers of a second work function metal and the semiconductor channel material vertically aligned and stacked one on top of another, the upper nanosheet stack vertically aligned and stacked on top of the lower nanosheet stack, wherein at least a portion of the first work function metal and a portion of the second work function metal are disposed on opposite sides of the nanosheet stack,
    wherein a first memory cell of the two memory cells comprising the lower nanosheet stack comprises a first threshold voltage and a second memory cell of the two memory cells comprising the upper nanosheet stack comprises a second threshold voltage, and
    wherein the first threshold voltage is different than the second threshold voltage.

2. The semiconductor device according to claim 1, further comprising:
    a spacer separating the lower nanosheet stack from the upper nanosheet stack.

3. The semiconductor device according to claim 2, further comprising:
    a lower isolation disposed on a first side of the first nanosheet stack in direct contact with sidewalls of the lower nanosheet stack, wherein the lower isolation extends from the spacer down to the substrate; and
    an upper isolation disposed on a second side of the first nanosheet stack in direct contact with sidewalls of the upper nanosheet stack, wherein the upper isolation extends above the first nanosheet stack from the spacer, wherein the lower isolation and the upper isolation are disposed on opposite sides of the first nanosheet stack.

4. The semiconductor device according to claim 1, further comprising:
    a gate isolation structure separating the first nanosheet stack from adjacent nanosheet stacks in an array of nanosheet stacks.

5. The semiconductor device according to claim 1, further comprising:
    a first contact connected to the portion of the first work function metal; and a second contact connected to the portion of the second work function metal.

6. The semiconductor device according to claim 1, further comprising:
a second nanosheet stack comprising:
a second lower nanosheet stack on the substrate comprising alternating layers of the first work function metal and the semiconductor channel material vertically aligned and stacked one on top of another; and
a second upper nanosheet stack on the substrate comprising alternating layers of the first work function metal and the semiconductor channel material vertically aligned and stacked one on top of another, the second upper nanosheet stack vertically aligned and stacked on top of the second lower nanosheet stack.

7. The semiconductor device according to claim 1, further comprising:
a third nanosheet stack of two memory cells comprising:
a third lower nanosheet stack on the substrate comprising alternating layers of the second work function metal and the semiconductor channel material vertically aligned and stacked one on top of another;
a third upper nanosheet stack on the substrate comprising alternating layers of the second work function metal and the semiconductor channel material vertically aligned and stacked one on top of another, the third upper nanosheet stack vertically aligned and stacked on top of the third lower nanosheet stack.

8. A semiconductor device comprising:
a lower nanosheet stack on a substrate comprising alternating layers of a first work function metal and a semiconductor channel material vertically aligned and stacked one on top of another; and
an upper nanosheet stack comprising alternating layers of a second work function metal and the semiconductor channel material vertically aligned and stacked one on top of another, the upper nanosheet stack vertically aligned and stacked on top of the lower nanosheet stack;
a single contact connected to both the first work function metal of the lower nanosheet stack and the second work function metal of the upper nanosheet stack, wherein at least a portion of the first work function metal and a portion of the second work function metal are disposed on opposite sides of the nanosheet stack,
wherein a first memory cell of the two memory cells comprising the lower nanosheet stack comprises a first threshold voltage and a second memory cell of the two memory cells comprising the upper nanosheet stack comprises a second threshold voltage, wherein the first threshold voltage is different than the second threshold voltage.

9. The semiconductor device according to claim 8, further comprising:
a spacer between the lower nanosheet stack and the upper nanosheet stack, wherein vertical sides of the spacer are coplanar with vertical sides of the lower nanosheet stack and vertical sides of the upper nanosheet stack.

10. The semiconductor device according to claim 8, further comprising:
a gate isolation structure between adjacent nanosheet stacks in an array of nanosheet stacks.

11. The semiconductor device according to claim 8, further comprising:
a lower isolation vertically coplanar with a side of the lower nanosheet stack; and
an upper isolation vertically coplanar with an opposite side of the upper nanosheet stack.

12. The semiconductor device according to claim 8, further comprising:
a second nanosheet stack of two memory cells comprising:
a second lower nanosheet stack on the substrate comprising alternating layers of the first work function metal and the semiconductor channel material vertically aligned and stacked one on top of another;
a second upper nanosheet stack comprising alternating layers of the first work function metal and the semiconductor channel material vertically aligned and stacked one on top of another, the second upper nanosheet stack vertically aligned and stacked on top of the second lower nanosheet stack; and
a second single contact connected to opposite sides of the second nanosheet stack to both the first work function metal of the second lower nanosheet stack and to the first work function metal of the second upper nanosheet stack.

13. The semiconductor device according to claim 8, further comprising:
a third nanosheet stack of two memory cells comprising:
a third lower nanosheet stack on the substrate comprising alternating layers of the second work function metal and the semiconductor channel material vertically aligned and stacked one on top of another;
an third upper nanosheet stack on the substrate comprising alternating layers of the second work function metal and the semiconductor channel material vertically aligned and stacked one on top of another, the third upper nanosheet stack vertically aligned and stacked on top of the third lower nanosheet stack; and
a third single contact connected to opposite sides of the third nanosheet stack to both the second work function metal of the third lower nanosheet stack and to the second work function metal of the third upper nanosheet stack.

14. A method comprising:
forming a nanosheet stack on a substrate, the nanosheet stack comprising an upper nanosheet stack vertically aligned above a lower nanosheet stack, the upper nanosheet stack and the lower nanosheet stack each comprising alternating layers of a sacrificial material and a semiconductor channel material vertically aligned and stacked one on top of another;
removing the sacrificial material layers of the lower nanosheet stack;
patterning a first work function metal surrounding the semiconductor channel layers of lower nanosheet stack;
removing the sacrificial material layers of the upper nanosheet stack; and
patterning a second work function metal surrounding the semiconductor channel layers of the upper nanosheet stack,
wherein a first memory cell comprising the lower nanosheet stack comprises a first threshold voltage and a second memory cell of the upper nanosheet stack comprises a second threshold voltage, wherein the first threshold voltage is different than the threshold voltage.

15. The method according to claim 14, further comprising:
forming a first contact connected to the first work function metal on of the lower nanosheet stack; and forming a second contact connected to the second work function metal on an opposite side of the upper nanosheet stack.

16. The method according to claim 15, further comprising:
applying a read voltage to the first contact and to the second contact, wherein the first threshold voltage is greater than the read voltage and the read voltage is greater than the second threshold voltage;
determining the upper nanosheet stack is a first memory state, based on the upper nanosheet stack being off, dependent upon the first threshold voltage being greater than the read voltage; and
determining the lower nanosheet stack is in a second memory state, based on the lower nanosheet stack being on, dependent upon the second threshold voltage being less than the read voltage.

17. The method according to claim 14, further comprising:
forming a second nanosheet stack on the substrate, the second nanosheet stack comprising a second upper nanosheet stack vertically aligned above a second lower nanosheet stack, the second upper nanosheet stack and the second lower nanosheet stack each comprising alternating layers of the sacrificial material and the semiconductor channel material vertically aligned and stacked one on top of another;
removing the sacrificial material layers of the second nanosheet stack;
patterning the first work function metal surrounding the semiconductor channel layers of second nanosheet stack.

18. The method according to claim 14, further comprising:
forming a third nanosheet stack on the substrate, the third nanosheet stack comprising a third upper nanosheet stack vertically aligned above a third lower nanosheet stack, the third upper nanosheet stack and the third lower nanosheet stack each comprising alternating layers of a sacrificial material and a semiconductor channel material vertically aligned and stacked one on top of another;
removing the sacrificial material layers of the third nanosheet stack;
patterning the second work function metal surrounding the semiconductor channel layers of the third nanosheet stack.

19. The method according to claim 14, further comprising:
forming upper source drain regions extending laterally from either end of the semiconductor channel material layers of the upper nanosheet stack;
forming lower source drain regions extending laterally from either end of the semiconductor channel material layers of the upper nanosheet stack.

20. The method according to claim 14, further comprising:
forming a first contact connected to both the first work function metal on a side of the lower nanosheet stack and to the second work function metal on an opposite side of the upper nanosheet stack.

* * * * *